United States Patent
Bück

(10) Patent No.: US 11,075,331 B2
(45) Date of Patent: Jul. 27, 2021

(54) THERMOELECTRIC DEVICE HAVING CIRCUITRY WITH STRUCTURAL RIGIDITY

(71) Applicant: Gentherm Incorporated, Northville, MI (US)

(72) Inventor: Werner Bück, Königsbrunn (DE)

(73) Assignee: GENTHERM INCORPORATED, Northville, MI (US)

( * ) Notice: Subject to any disclaimer, the term of this patent is extended or adjusted under 35 U.S.C. 154(b) by 30 days.

(21) Appl. No.: 16/377,134

(22) Filed: Apr. 5, 2019

(65) Prior Publication Data
US 2020/0035899 A1 Jan. 30, 2020

Related U.S. Application Data

(60) Provisional application No. 62/712,143, filed on Jul. 30, 2018, provisional application No. 62/712,131, (Continued)

(51) Int. Cl.
*H01L 35/32* (2006.01)
*H01L 35/34* (2006.01)
(Continued)

(52) U.S. Cl.
CPC .............. *H01L 35/32* (2013.01); *H01L 35/02* (2013.01); *H01L 35/04* (2013.01); *H01L 35/30* (2013.01); *H01L 35/34* (2013.01)

(58) Field of Classification Search
CPC .................. H01L 35/00–34; H01L 27/16
(Continued)

(56) References Cited

U.S. PATENT DOCUMENTS 1,120,781 A   12/1914   Altenkirch et al.
1,839,156 A   12/1931   Lumpkin
(Continued)

FOREIGN PATENT DOCUMENTS

CA        979490      12/1975
CN        2128076      3/1993
(Continued)

OTHER PUBLICATIONS

U.S. Appl. No. 14/821,514, filed Aug. 7, 2015, Lofy.
(Continued)

*Primary Examiner* — Bach T Dinh
(74) *Attorney, Agent, or Firm* — Knobbe, Martens, Olson & Bear, LLP

(57) ABSTRACT

A thermoelectric device includes a thermally conductive first plate and at least one thermoelectric sub-assembly. The first plate has a layer with a plurality of electrically conductive first portions and a plurality of electrically insulating second portions separating the first portions from one another. The at least one thermoelectric sub-assembly includes a thermally conductive second plate and a plurality of thermoelectric elements in a region between the first plate and the second plate. The plurality of thermoelectric elements is in electrical communication with the plurality of electrically conductive portions of the first plate, in electrical communication with electrically conductive portions of the second plate, and in thermal communication with the first plate and the second plate. The plurality of electrically insulating second portions includes a plurality of segments at least partially outside the region, the segments configured to avoid degradation of a structural rigidity of the first plate.

8 Claims, 10 Drawing Sheets

Related U.S. Application Data filed on Jul. 30, 2018, provisional application No. 62/715,709, filed on Aug. 7, 2018, provisional application No. 62/712,112, filed on Jul. 30, 2018.

(51) Int. Cl.
*H01L 35/30* (2006.01)
*H01L 35/04* (2006.01)
*H01L 35/02* (2006.01)

(58) Field of Classification Search
USPC .................................. 136/200–242
See application file for complete search history.

(56) References Cited

U.S. PATENT DOCUMENTS

| | | |
|---|---|---|
| 2,235,620 A | 3/1941 | Nessell |
| 2,362,259 A | 11/1944 | Findley |
| 2,363,168 A | 11/1944 | Findley |
| 2,461,432 A | 2/1949 | Mitchell |
| 2,462,984 A | 3/1949 | Maddison |
| 2,493,067 A | 1/1950 | Goldsmith |
| 2,499,901 A | 3/1950 | Brown, Jr. |
| 2,512,559 A | 6/1950 | Williams |
| 2,519,241 A | 8/1950 | Findley |
| 2,782,834 A | 2/1957 | Vigo |
| 2,791,956 A | 5/1957 | Guest |
| 2,813,708 A | 11/1957 | Frey |
| 2,884,956 A | 5/1959 | Perlin |
| 2,931,286 A | 4/1960 | Fry, Sr. et al. |
| 2,938,357 A | 5/1960 | Sheckler |
| 2,959,017 A | 11/1960 | Gilman et al. |
| 2,975,638 A | 3/1961 | Morrison |
| 2,976,700 A | 3/1961 | Jackson |
| 2,984,077 A | 5/1961 | Gaskill |
| 2,992,538 A | 7/1961 | Siegfried |
| 3,004,393 A | 10/1961 | Alsing |
| 3,006,979 A | 10/1961 | Rich |
| 3,019,609 A | 2/1962 | Pietsch |
| 3,030,145 A | 4/1962 | Kottemann |
| 3,039,817 A | 6/1962 | Taylor |
| 3,071,495 A | 1/1963 | Hanlein |
| 3,077,079 A | 2/1963 | Pietsch |
| 3,085,405 A | 4/1963 | Frantti |
| 3,090,206 A | 5/1963 | Anders |
| 3,129,116 A | 4/1964 | Corry |
| 3,136,577 A | 6/1964 | Richard |
| 3,137,142 A | 6/1964 | Venema |
| 3,137,523 A | 6/1964 | Karner |
| 3,138,934 A | 6/1964 | Roane |
| 3,178,894 A | 4/1965 | Mole et al. |
| 3,178,895 A | 4/1965 | Mole et al. |
| 3,186,240 A | 6/1965 | Daubert |
| 3,197,342 A | 7/1965 | Neild |
| 3,212,275 A | 10/1965 | Tillman |
| 3,240,628 A | 3/1966 | Sonntag, Jr. |
| 3,253,649 A | 5/1966 | Laing |
| 3,266,064 A | 8/1966 | Figman |
| 3,282,267 A | 11/1966 | Eidus |
| 3,298,195 A | 1/1967 | Raskhodoff |
| 3,300,649 A | 1/1967 | Strawn |
| 3,325,312 A | 6/1967 | Sonntag, Jr. |
| 3,326,727 A | 6/1967 | Fritts |
| 3,351,498 A | 11/1967 | Shinn et al. |
| 3,366,164 A | 1/1968 | Newton |
| 3,392,535 A | 7/1968 | De Castelet |
| 3,442,718 A | 5/1969 | Dingwall |
| 3,486,177 A | 12/1969 | Marshack |
| 3,505,728 A | 4/1970 | Hare et al. |
| 3,508,974 A | 4/1970 | Bressler |
| 3,522,106 A | 7/1970 | Debiesse et al. |
| 3,527,621 A | 9/1970 | Newton |
| 3,529,310 A | 9/1970 | Olmo |
| 3,550,523 A | 12/1970 | Segal |
| 3,554,815 A | 1/1971 | Osborn |
| 3,599,437 A | 8/1971 | Panas |
| 3,607,444 A | 9/1971 | Debucs |
| 3,615,870 A | 10/1971 | Crouthamel |
| 3,626,704 A | 12/1971 | Coe, Jr. |
| 3,627,299 A | 12/1971 | Schwartze et al. |
| 3,632,451 A | 1/1972 | Abbott |
| 3,635,037 A | 1/1972 | Hubert |
| 3,640,456 A | 2/1972 | Sturgis |
| 3,648,469 A | 3/1972 | Chapman |
| 3,657,014 A | 4/1972 | Faber |
| 3,663,307 A | 5/1972 | Mole |
| 3,681,929 A | 8/1972 | Schering |
| 3,703,141 A | 11/1972 | Pernoud |
| 3,726,100 A | 4/1973 | Widakowich |
| 3,767,470 A | 10/1973 | Hines |
| 3,779,814 A | 12/1973 | Miles et al. |
| 3,786,230 A | 1/1974 | Brandenburg, Jr. |
| 3,819,418 A | 6/1974 | Winkler et al. |
| 3,839,876 A | 10/1974 | Privas |
| 3,859,143 A | 1/1975 | Krebs |
| 3,870,568 A | 3/1975 | Oesterhelt et al. |
| 3,876,860 A | 4/1975 | Nomura et al. |
| 3,880,674 A | 4/1975 | Saunders |
| 3,894,213 A | 7/1975 | Agarwala |
| 3,899,054 A | 8/1975 | Huntress et al. |
| 3,902,923 A | 9/1975 | Evans et al. |
| 3,916,151 A | 10/1975 | Reix |
| 3,926,052 A | 12/1975 | Bechtel |
| 3,927,299 A | 12/1975 | Sturgis |
| 3,928,876 A | 12/1975 | Starr |
| 3,958,324 A | 5/1976 | Alais et al. |
| 4,002,108 A | 1/1977 | Drori |
| 4,038,831 A | 8/1977 | Gaudel et al. |
| 4,044,824 A | 8/1977 | Eskeli |
| 4,055,053 A | 10/1977 | Elfving |
| 4,056,406 A | 11/1977 | Markman et al. |
| 4,065,936 A | 1/1978 | Fenton et al. |
| 4,124,794 A | 11/1978 | Eder |
| 4,125,122 A | 11/1978 | Stachurski |
| 4,195,687 A | 4/1980 | Taziker |
| 4,199,953 A | 4/1980 | Richter, Jr. et al. |
| 4,211,889 A | 7/1980 | Kortier et al. |
| 4,223,205 A | 9/1980 | Sturgis |
| 4,224,565 A | 9/1980 | Sosniak et al. |
| 4,242,778 A | 1/1981 | Kay |
| 4,281,516 A | 8/1981 | Berthet et al. |
| 4,297,841 A | 11/1981 | Cheng |
| 4,297,849 A | 11/1981 | Buffet |
| 4,301,658 A | 11/1981 | Reed |
| 4,315,599 A | 2/1982 | Biancardi |
| 4,336,444 A | 6/1982 | Bice et al. |
| 4,338,944 A | 7/1982 | Arkans |
| 4,391,009 A | 7/1983 | Schild et al. |
| 4,402,188 A | 9/1983 | Skala |
| 4,413,857 A | 11/1983 | Hayashi |
| 4,420,940 A | 12/1983 | Buffet |
| 4,423,308 A | 12/1983 | Callaway et al. |
| 4,437,702 A | 3/1984 | Agosta |
| 4,438,070 A | 3/1984 | Stephens et al. |
| 4,448,028 A | 5/1984 | Chao et al. |
| 4,459,428 A | 7/1984 | Chou |
| 4,491,173 A | 1/1985 | Demand |
| 4,493,939 A | 1/1985 | Blaske et al. |
| 4,494,380 A | 1/1985 | Cross |
| 4,497,973 A | 2/1985 | Heath et al. |
| 4,499,329 A | 2/1985 | Benicourt et al. |
| 4,506,510 A | 3/1985 | Tircot |
| 4,518,700 A | 5/1985 | Stephens |
| 4,518,847 A | 5/1985 | Horst, Sr. et al. |
| 4,549,134 A | 10/1985 | Weiss |
| 4,554,968 A | 11/1985 | Haas |
| 4,567,351 A | 1/1986 | Kitagawa et al. |
| 4,572,430 A | 2/1986 | Takagi et al. |
| 4,611,089 A | 9/1986 | Elsner et al. |
| 4,634,803 A | 1/1987 | Mathiprakasam |
| 4,639,883 A | 1/1987 | Michaelis |
| 4,651,019 A | 3/1987 | Gilbert et al. |
| 4,665,707 A | 5/1987 | Hamilton |
| 4,671,567 A | 6/1987 | Frobose |

(56) References Cited

U.S. PATENT DOCUMENTS

| | | |
|---|---|---|
| 4,677,416 A | 6/1987 | Nishimoto et al. |
| 4,685,727 A | 8/1987 | Cremer et al. |
| 4,688,390 A | 8/1987 | Sawyer |
| 4,704,320 A | 11/1987 | Mizunoya et al. |
| 4,711,294 A | 12/1987 | Jacobs et al. |
| 4,712,832 A | 12/1987 | Antolini et al. |
| 4,730,459 A | 3/1988 | Schicklin et al. |
| 4,731,338 A | 3/1988 | Ralston et al. |
| 4,777,802 A | 10/1988 | Feher |
| 4,782,664 A | 11/1988 | Sterna et al. |
| 4,791,274 A | 12/1988 | Horst |
| 4,793,651 A | 12/1988 | Inagaki et al. |
| 4,802,929 A | 2/1989 | Schock |
| 4,812,733 A | 3/1989 | Tobey |
| 4,823,554 A | 4/1989 | Trachtenberg et al. |
| 4,825,488 A | 5/1989 | Bedford |
| 4,828,627 A | 5/1989 | Connery |
| 4,853,992 A | 8/1989 | Yu |
| 4,907,060 A | 3/1990 | Nelson et al. |
| 4,923,248 A | 5/1990 | Feher |
| 4,947,648 A | 8/1990 | Harwell et al. |
| 4,969,684 A | 11/1990 | Zarotti |
| 4,981,324 A | 1/1991 | Law |
| 4,988,847 A | 1/1991 | Argos et al. |
| 4,989,626 A | 2/1991 | Takagi et al. |
| 4,997,230 A | 3/1991 | Spitalnick |
| 5,002,336 A | 3/1991 | Feher |
| 5,006,178 A | 4/1991 | Bijvoets |
| 5,012,325 A | 4/1991 | Mansuria et al. |
| 5,014,909 A | 5/1991 | Yasuo |
| 5,016,304 A | 5/1991 | Ryhiner |
| 5,022,462 A | 6/1991 | Flint et al. |
| 5,057,490 A | 10/1991 | Skertic |
| 5,070,937 A | 12/1991 | Mougin et al. |
| 5,077,709 A | 12/1991 | Feher |
| 5,088,790 A | 2/1992 | Wainwright et al. |
| 5,097,674 A | 3/1992 | Imaiida et al. |
| 5,102,189 A | 4/1992 | Saito et al. |
| 5,106,161 A | 4/1992 | Meiller |
| 5,111,025 A | 5/1992 | Barma et al. |
| 5,111,664 A | 5/1992 | Yang |
| 5,117,638 A | 6/1992 | Feher |
| 5,119,640 A | 6/1992 | Conrad |
| 5,125,238 A | 6/1992 | Ragan et al. |
| 5,148,977 A | 9/1992 | Hibino et al. |
| 5,166,777 A | 11/1992 | Kataoka |
| 5,171,372 A | 12/1992 | Recine, Sr. |
| 5,180,293 A | 1/1993 | Hartl |
| 5,187,349 A | 2/1993 | Curhan et al. |
| 5,188,286 A | 2/1993 | Pence, IV |
| 5,228,923 A | 7/1993 | Hed |
| 5,232,516 A | 8/1993 | Hed |
| 5,254,178 A | 10/1993 | Yamada et al. |
| 5,255,735 A | 10/1993 | Raghava et al. |
| 5,256,857 A | 10/1993 | Curhan et al. |
| 5,265,599 A | 11/1993 | Stephenson et al. |
| 5,278,936 A | 1/1994 | Shao |
| 5,279,128 A | 1/1994 | Tomatsu et al. |
| 5,296,534 A | 3/1994 | Senuma et al. |
| 5,335,381 A | 8/1994 | Chang |
| 5,367,728 A | 11/1994 | Chang |
| 5,372,402 A | 12/1994 | Kuo |
| 5,375,421 A | 12/1994 | Hsieh |
| 5,382,075 A | 1/1995 | Shih |
| 5,385,382 A | 1/1995 | Single, II et al. |
| 5,409,547 A | 4/1995 | Watanabe et al. |
| 5,413,166 A | 5/1995 | Kerner et al. |
| 5,416,935 A | 5/1995 | Nieh |
| 5,419,489 A | 5/1995 | Burd |
| 5,419,780 A | 5/1995 | Suski |
| 5,429,680 A | 7/1995 | Fuschetti |
| 5,430,322 A | 7/1995 | Koyanagi et al. |
| 5,448,788 A | 9/1995 | Wu |
| 5,448,891 A | 9/1995 | Nakagiri et al. |
| 5,456,081 A | 10/1995 | Chrysler et al. |
| 5,473,783 A | 12/1995 | Allen |
| 5,493,742 A | 2/1996 | Klearman |
| 5,493,864 A | 2/1996 | Pomerene et al. |
| 5,497,625 A | 3/1996 | Manz et al. |
| 5,497,632 A | 3/1996 | Robinson |
| 5,505,520 A | 4/1996 | Frusti et al. |
| 5,515,238 A | 5/1996 | Fritz et al. |
| 5,524,439 A | 6/1996 | Gallup et al. |
| 5,542,503 A | 8/1996 | Dunn et al. |
| 5,544,487 A | 8/1996 | Attey et al. |
| 5,544,488 A | 8/1996 | Reid |
| 5,555,732 A | 9/1996 | Whiticar |
| 5,561,981 A | 10/1996 | Quisenberry et al. |
| 5,576,512 A | 11/1996 | Doke |
| 5,584,084 A | 12/1996 | Klearman et al. |
| 5,584,183 A | 12/1996 | Wright et al. |
| 5,594,609 A | 1/1997 | Lin |
| 5,597,200 A | 1/1997 | Gregory et al. |
| 5,601,399 A | 2/1997 | Okpara et al. |
| 5,606,639 A | 2/1997 | Lehoe et al. |
| 5,613,729 A | 3/1997 | Summer, Jr. |
| 5,613,730 A | 3/1997 | Buie et al. |
| 5,623,828 A | 4/1997 | Harrington |
| 5,626,021 A | 5/1997 | Karunasiri et al. |
| 5,626,386 A | 5/1997 | Lush |
| 5,634,342 A | 6/1997 | Peeters et al. |
| 5,637,921 A | 6/1997 | Burward-Hoy |
| 5,640,728 A | 6/1997 | Graebe |
| 5,642,539 A | 7/1997 | Kuo |
| 5,645,314 A | 7/1997 | Liou |
| 5,650,904 A | 7/1997 | Gilley et al. |
| 5,653,741 A | 8/1997 | Grant |
| 5,660,310 A | 8/1997 | LeGrow |
| 5,667,622 A | 9/1997 | Hasegawa et al. |
| 5,675,852 A | 10/1997 | Watkins |
| 5,682,748 A | 11/1997 | DeVilbiss et al. |
| 5,690,849 A | 11/1997 | DeVilbiss et al. |
| 5,692,952 A | 12/1997 | Chih-Hung |
| 5,704,213 A | 1/1998 | Smith et al. |
| 5,705,770 A | 1/1998 | Ogassawara et al. |
| 5,715,695 A | 2/1998 | Lord |
| 5,721,804 A | 2/1998 | Greene, III |
| 5,724,818 A | 3/1998 | Iwata et al. |
| 5,729,981 A | 3/1998 | Markus et al. |
| 5,734,122 A | 3/1998 | Aspden |
| 5,761,908 A | 6/1998 | Oas et al. |
| 5,761,909 A | 6/1998 | Hughes et al. |
| 5,772,500 A | 6/1998 | Harvey et al. |
| 5,798,583 A | 8/1998 | Morita |
| 5,800,490 A | 9/1998 | Patz et al. |
| 5,802,855 A | 9/1998 | Yamaguchi et al. |
| 5,802,856 A | 9/1998 | Schaper et al. |
| 5,822,993 A | 10/1998 | Attey |
| 5,827,424 A | 10/1998 | Gillis et al. |
| 5,833,321 A | 11/1998 | Kim et al. |
| 5,850,741 A | 12/1998 | Feher |
| 5,860,472 A | 1/1999 | Batchelder |
| 5,865,031 A | 2/1999 | Itakura |
| 5,867,990 A | 2/1999 | Ghoshal |
| 5,871,151 A | 2/1999 | Fiedrich |
| 5,884,485 A | 3/1999 | Yamaguchi et al. |
| 5,884,486 A | 3/1999 | Hughes et al. |
| 5,887,304 A | 3/1999 | Von der Heyde |
| 5,888,261 A | 3/1999 | Fortune |
| 5,895,964 A | 4/1999 | Nakayama |
| 5,900,071 A | 5/1999 | Harman |
| 5,902,014 A | 5/1999 | Dinkel et al. |
| 5,921,100 A | 7/1999 | Yoshinori et al. |
| 5,921,314 A | 7/1999 | Schuller et al. |
| 5,921,858 A | 7/1999 | Kawai et al. |
| 5,924,289 A | 7/1999 | Bishop, II |
| 5,924,766 A | 7/1999 | Esaki et al. |
| 5,924,767 A | 7/1999 | Pietryga |
| 5,927,817 A | 7/1999 | Ekman et al. |
| 5,934,748 A | 8/1999 | Faust et al. |
| 5,936,192 A | 8/1999 | Tauchi |
| 5,937,908 A | 8/1999 | Inoshiri et al. |
| 5,948,303 A | 9/1999 | Larson |
| 5,950,067 A | 9/1999 | Maegawa et al. |

(56) References Cited

U.S. PATENT DOCUMENTS

| | | |
|---|---|---|
| 5,952,728 A | 9/1999 | Imanishi et al. |
| 5,959,341 A | 9/1999 | Tsuno et al. |
| 5,966,941 A | 10/1999 | Ghoshal |
| 5,987,893 A | 11/1999 | Schultz-Harder et al. |
| 5,988,568 A | 11/1999 | Drews |
| 5,992,154 A | 11/1999 | Kawada et al. |
| 5,994,637 A | 11/1999 | Imanushi et al. |
| 5,995,711 A | 11/1999 | Fukuoka et al. |
| 6,000,225 A | 12/1999 | Ghoshal |
| 6,003,950 A | 12/1999 | Larsson |
| 6,006,524 A | 12/1999 | Park |
| 6,019,420 A | 2/2000 | Faust et al. |
| 6,038,865 A | 3/2000 | Watanabe et al. |
| 6,048,024 A | 4/2000 | Wallman |
| 6,049,655 A | 4/2000 | Vazirani |
| 6,052,853 A | 4/2000 | Schmid |
| 6,053,163 A | 4/2000 | Bass |
| 6,059,018 A | 5/2000 | Yoshinori et al. |
| 6,062,641 A | 5/2000 | Suzuki et al. |
| 6,072,924 A | 6/2000 | Sato et al. |
| 6,072,938 A | 6/2000 | Peterson et al. |
| 6,073,998 A | 6/2000 | Siarkowski et al. |
| 6,079,485 A | 6/2000 | Esaki et al. |
| 6,084,172 A | 7/2000 | Kishi et al. |
| 6,085,369 A | 7/2000 | Feher |
| 6,086,831 A | 7/2000 | Harness et al. |
| 6,087,638 A | 7/2000 | Silverbrook |
| 6,094,919 A | 8/2000 | Bhatia |
| 6,096,966 A | 8/2000 | Nishimoto et al. |
| 6,097,088 A | 8/2000 | Sakuragi |
| 6,100,463 A | 8/2000 | Ladd et al. |
| 6,101,815 A | 8/2000 | Van Oort et al. |
| 6,103,967 A | 8/2000 | Cauchy et al. |
| 6,105,373 A | 8/2000 | Watanabe et al. |
| 6,109,688 A | 8/2000 | Wurz et al. |
| 6,112,525 A | 9/2000 | Yoshida et al. |
| 6,112,531 A | 9/2000 | Yamaguchi |
| 6,116,029 A | 9/2000 | Krawec |
| 6,119,463 A | 9/2000 | Bell |
| 6,120,370 A | 9/2000 | Asou et al. |
| 6,127,619 A | 10/2000 | Xi et al. |
| 6,141,969 A | 11/2000 | Launchbury et al. |
| 6,145,925 A | 11/2000 | Eksin et al. |
| 6,158,224 A | 12/2000 | Hu et al. |
| 6,161,241 A | 12/2000 | Zysman |
| 6,161,388 A | 12/2000 | Ghoshal |
| 6,164,076 A | 12/2000 | Chu et al. |
| 6,164,719 A | 12/2000 | Rauh |
| 6,171,333 B1 | 1/2001 | Nelson et al. |
| 6,178,292 B1 | 1/2001 | Fukuoka et al. |
| 6,179,706 B1 | 1/2001 | Yoshinori et al. |
| 6,186,592 B1 | 2/2001 | Orizakis et al. |
| 6,189,966 B1 | 2/2001 | Faust et al. |
| 6,189,967 B1 | 2/2001 | Short |
| 6,196,627 B1 | 3/2001 | Faust et al. |
| 6,196,839 B1 | 3/2001 | Ross |
| 6,206,465 B1 | 3/2001 | Faust et al. |
| 6,213,198 B1 | 4/2001 | Shikata et al. |
| 6,222,243 B1 | 4/2001 | Kishi et al. |
| 6,223,539 B1 | 5/2001 | Bell |
| 6,226,994 B1 | 5/2001 | Yamada et al. |
| 6,233,959 B1 | 5/2001 | Kang et al. |
| 6,250,083 B1 | 6/2001 | Chou |
| 6,256,996 B1 | 7/2001 | Ghoshal |
| 6,262,357 B1 | 7/2001 | Johnson et al. |
| 6,263,530 B1 | 7/2001 | Feher |
| 6,266,962 B1 | 7/2001 | Ghoshal |
| 6,274,802 B1 | 8/2001 | Fukuda et al. |
| 6,282,907 B1 | 9/2001 | Ghoshal |
| 6,289,982 B1 | 9/2001 | Naji |
| 6,291,803 B1 | 9/2001 | Fourrey |
| 6,302,196 B1 | 10/2001 | Haussmann |
| 6,306,673 B1 | 10/2001 | Imanishi et al. |
| 6,319,744 B1 | 11/2001 | Hoon et al. |
| 6,320,280 B1 | 11/2001 | Kanesaka |
| 6,326,610 B1 | 12/2001 | Muramatsu et al. |
| 6,336,237 B1 | 1/2002 | Schmid |
| 6,338,251 B1 | 1/2002 | Ghoshal |
| 6,341,395 B1 | 1/2002 | Chao |
| 6,347,521 B1 | 2/2002 | Kadotani et al. |
| 6,357,518 B1 | 3/2002 | Sugimoto et al. |
| 6,378,311 B1 | 4/2002 | McCordic |
| 6,385,976 B1 | 5/2002 | Yamamura et al. |
| 6,391,676 B1 | 5/2002 | Tsuzaki et al. |
| 6,393,842 B2 | 5/2002 | Kim et al. |
| 6,400,013 B1 | 6/2002 | Tsuzaki et al. |
| 6,402,470 B1 | 6/2002 | Kvasnak et al. |
| 6,407,435 B1 | 6/2002 | Ma et al. |
| 6,410,971 B1 | 6/2002 | Otey |
| 6,425,527 B1 | 7/2002 | Smole |
| 6,427,449 B1 | 8/2002 | Logan et al. |
| 6,434,328 B2 | 8/2002 | Rutherford |
| 6,438,964 B1 | 8/2002 | Giblin |
| 6,446,442 B1 | 9/2002 | Batchelor et al. |
| 6,452,740 B1 | 9/2002 | Ghoshal |
| 6,470,696 B1 | 10/2002 | Palfy et al. |
| 6,474,073 B1 | 11/2002 | Uetsuji et al. |
| 6,477,844 B2 | 11/2002 | Ohkubo et al. |
| 6,481,801 B1 | 11/2002 | Schmale |
| 6,487,739 B1 | 12/2002 | Harker |
| 6,489,551 B2 | 12/2002 | Chu et al. |
| 6,490,879 B1 | 12/2002 | Lloyd et al. |
| 6,492,585 B1 | 12/2002 | Zamboni et al. |
| 6,493,888 B1 | 12/2002 | Salvatini et al. |
| 6,493,889 B2 | 12/2002 | Kocurek |
| 6,499,306 B2 | 12/2002 | Gillen |
| 6,509,704 B1 | 1/2003 | Brown |
| 6,511,125 B1 | 1/2003 | Gendron |
| 6,519,949 B1 | 2/2003 | Wernlund et al. |
| 6,530,231 B1 | 3/2003 | Nagy et al. |
| 6,539,725 B2 | 4/2003 | Bell |
| 6,541,737 B1 | 4/2003 | Eksin et al. |
| 6,541,743 B2 | 4/2003 | Chen |
| 6,546,576 B1 | 4/2003 | Lin |
| 6,548,750 B1 | 4/2003 | Picone |
| 6,548,894 B2 | 4/2003 | Chu et al. |
| 6,552,256 B2 | 4/2003 | Shakouri et al. |
| 6,557,353 B1 | 5/2003 | Fusco et al. |
| 6,563,039 B2 | 5/2003 | Caillat et al. |
| RE38,128 E | 6/2003 | Gallup et al. |
| 6,571,564 B2 | 6/2003 | Upadhye et al. |
| 6,573,596 B2 | 6/2003 | Saika |
| 6,574,967 B1 | 6/2003 | Park et al. |
| 6,578,986 B2 | 6/2003 | Swaris et al. |
| 6,580,025 B2 | 6/2003 | Guy |
| 6,581,225 B1 | 6/2003 | Imai |
| 6,583,638 B2 | 6/2003 | Costello et al. |
| 6,598,251 B2 | 7/2003 | Habboub et al. |
| 6,598,403 B1 | 7/2003 | Ghoshal |
| 6,598,405 B2 | 7/2003 | Bell |
| 6,604,576 B2 | 8/2003 | Noda et al. |
| 6,604,785 B2 | 8/2003 | Bargheer et al. |
| 6,605,955 B1 | 8/2003 | Costello et al. |
| 6,606,754 B1 | 8/2003 | Flick |
| 6,606,866 B2 | 8/2003 | Bell |
| 6,613,972 B2 | 9/2003 | Cohen et al. |
| 6,619,044 B2 | 9/2003 | Batchelor et al. |
| 6,619,736 B2 | 9/2003 | Stowe et al. |
| 6,625,990 B2 | 9/2003 | Bell |
| 6,626,488 B2 | 9/2003 | Pfahler |
| 6,629,724 B2 | 10/2003 | Ekern et al. |
| 6,637,210 B2 | 10/2003 | Bell |
| 6,644,735 B2 | 11/2003 | Bargheer et al. |
| 6,672,076 B2 | 1/2004 | Bell |
| 6,676,207 B2 | 1/2004 | Rauh et al. |
| 6,684,437 B2 | 2/2004 | Koenig |
| 6,686,532 B1 | 2/2004 | MacRis |
| 6,687,937 B2 | 2/2004 | Harker |
| 6,695,402 B2 | 2/2004 | Sloan, Jr. |
| 6,700,052 B2 | 3/2004 | Bell |
| 6,700,053 B2 | 3/2004 | Hara et al. |
| 6,705,089 B2 | 3/2004 | Chu et al. |
| 6,708,352 B2 | 3/2004 | Salvatini et al. |
| 6,711,767 B2 | 3/2004 | Klamm |

(56) References Cited

U.S. PATENT DOCUMENTS

| | | |
|---|---|---|
| 6,711,904 B1 | 3/2004 | Law et al. |
| 6,718,954 B2 | 4/2004 | Ryon |
| 6,719,039 B2 | 4/2004 | Calaman et al. |
| 6,725,669 B2 | 4/2004 | Melaragni |
| 6,727,422 B2 | 4/2004 | Macris |
| 6,730,115 B1 | 5/2004 | Heaton |
| 6,739,138 B2 | 5/2004 | Saunders et al. |
| 6,739,655 B1 | 5/2004 | Schwochert et al. |
| 6,743,972 B2 | 6/2004 | Macris |
| 6,761,399 B2 | 7/2004 | Bargheer et al. |
| 6,764,502 B2 | 7/2004 | Bieberich |
| 6,767,766 B2 | 7/2004 | Chu et al. |
| 6,772,829 B2 | 8/2004 | Lebrun |
| 6,774,346 B2 | 8/2004 | Clothier |
| 6,786,541 B2 | 9/2004 | Haupt et al. |
| 6,786,545 B2 | 9/2004 | Bargheer et al. |
| 6,790,481 B2 | 9/2004 | Bishop et al. |
| 6,793,016 B2 | 9/2004 | Aoki et al. |
| 6,804,966 B1 | 10/2004 | Chu et al. |
| 6,808,230 B2 | 10/2004 | Buss et al. |
| 6,812,395 B2 | 11/2004 | Bell |
| 6,815,814 B2 | 11/2004 | Chu et al. |
| 6,817,191 B2 | 11/2004 | Watanabe |
| 6,817,197 B1 | 11/2004 | Padfield |
| 6,817,675 B2 | 11/2004 | Buss et al. |
| 6,818,817 B2 | 11/2004 | Macris |
| 6,823,678 B1 | 11/2004 | Li |
| 6,828,528 B2 | 12/2004 | Stowe et al. |
| 6,832,732 B2 | 12/2004 | Burkett et al. |
| 6,834,509 B2 | 12/2004 | Palfy et al. |
| 6,840,305 B2 | 1/2005 | Zheng et al. |
| 6,840,576 B2 | 1/2005 | Ekern et al. |
| 6,841,957 B2 | 1/2005 | Brown |
| 6,845,622 B2 | 1/2005 | Sauciuc et al. |
| 6,855,158 B2 | 2/2005 | Stolpmann |
| 6,855,880 B2 | 2/2005 | Feher |
| 6,857,697 B2 | 2/2005 | Brennan et al. |
| 6,857,954 B2 | 2/2005 | Luedtke |
| 6,868,690 B2 | 3/2005 | Faqih |
| 6,871,365 B2 | 3/2005 | Flick et al. |
| 6,876,549 B2 | 4/2005 | Beitmal et al. |
| 6,880,346 B1 | 4/2005 | Tseng et al. |
| 6,886,351 B2 | 5/2005 | Palfy et al. |
| 6,892,807 B2 | 5/2005 | Fristedt et al. |
| 6,893,086 B2 | 5/2005 | Bajic et al. |
| 6,894,369 B2 | 5/2005 | Irino et al. |
| 6,904,629 B2 | 6/2005 | Wu |
| 6,907,739 B2 | 6/2005 | Bell |
| 6,923,216 B2 | 8/2005 | Extrand et al. |
| 6,935,122 B2 | 8/2005 | Huang |
| 6,942,728 B2 | 9/2005 | Caillat et al. |
| 6,948,321 B2 | 9/2005 | Bell |
| 6,954,944 B2 | 10/2005 | Feher |
| 6,959,555 B2 | 11/2005 | Bell |
| 6,962,195 B2 | 11/2005 | Smith et al. |
| 6,963,053 B2 | 11/2005 | Lutz |
| 6,967,309 B2 | 11/2005 | Wyatt et al. |
| 6,976,734 B2 | 12/2005 | Stoewe |
| 6,977,360 B2 | 12/2005 | Weiss |
| 6,981,380 B2 | 1/2006 | Chrysler et al. |
| 6,990,701 B1 | 1/2006 | Litvak |
| 7,000,490 B1 | 2/2006 | Micheels |
| 7,036,163 B2 | 5/2006 | Schmid |
| 7,040,710 B2 | 5/2006 | White et al. |
| 7,052,091 B2 | 5/2006 | Bajic et al. |
| 7,063,163 B2 | 6/2006 | Steele et al. |
| 7,066,306 B2 | 6/2006 | Gavin |
| 7,070,231 B1 | 7/2006 | Wong |
| 7,070,232 B2 | 7/2006 | Minegishi et al. |
| 7,075,034 B2 | 7/2006 | Bargheer et al. |
| 7,082,772 B2 | 8/2006 | Welch |
| 7,084,502 B2 | 8/2006 | Bottner et al. |
| 7,100,978 B2 | 9/2006 | Ekern et al. |
| 7,108,319 B2 | 9/2006 | Hartwich et al. |
| 7,111,465 B2 | 9/2006 | Bell |
| 7,114,771 B2 | 10/2006 | Lofy et al. |
| 7,124,593 B2 | 10/2006 | Feher |
| 7,131,689 B2 | 11/2006 | Brennan et al. |
| 7,134,715 B1 | 11/2006 | Fristedt et al. |
| 7,141,763 B2 | 11/2006 | Moroz |
| 7,147,279 B2 | 12/2006 | Bevan et al. |
| 7,165,281 B2 | 1/2007 | Larssson et al. |
| 7,168,758 B2 | 1/2007 | Bevan et al. |
| 7,178,344 B2 | 2/2007 | Bell |
| 7,201,441 B2 | 4/2007 | Stoewe et al. |
| 7,213,876 B2 | 5/2007 | Stoewe |
| 7,220,048 B2 | 5/2007 | Kohlgriiber et al. |
| 7,222,489 B2 | 5/2007 | Pastorino |
| 7,224,059 B2 | 5/2007 | Shimada et al. |
| 7,231,772 B2 | 6/2007 | Bell |
| 7,235,735 B2 | 6/2007 | Venkatasubramanian et al. |
| 7,244,887 B2 | 7/2007 | Miley |
| 7,246,496 B2 | 7/2007 | Goenka et al. |
| 7,272,936 B2 | 9/2007 | Feher |
| 7,273,981 B2 | 9/2007 | Bell |
| 7,299,639 B2 | 11/2007 | Leija et al. |
| 7,337,615 B2 | 3/2008 | Reidy |
| 7,338,117 B2 | 3/2008 | Iqbal et al. |
| 7,340,907 B2 | 3/2008 | Vogh et al. |
| 7,355,146 B2 | 4/2008 | Angelis et al. |
| 7,356,912 B2 | 4/2008 | Iqbal et al. |
| 7,360,365 B2 | 4/2008 | Codecasa et al. |
| 7,360,416 B2 | 4/2008 | Manaka et al. |
| 7,370,479 B2 | 5/2008 | Pfannenberg |
| 7,370,911 B2 | 5/2008 | Bajic et al. |
| 7,380,586 B2 | 6/2008 | Gawthrop |
| 7,421,845 B2 | 9/2008 | Bell |
| 7,425,034 B2 | 9/2008 | Bajic et al. |
| 7,426,835 B2 | 9/2008 | Bell et al. |
| 7,462,028 B2 | 12/2008 | Cherala et al. |
| 7,469,432 B2 | 12/2008 | Chambers |
| 7,475,464 B2 | 1/2009 | Lofy et al. |
| 7,475,551 B2 | 1/2009 | Ghoshal |
| 7,475,938 B2 | 1/2009 | Stoewe et al. |
| 7,478,869 B2 | 1/2009 | Lazanja et al. |
| 7,480,950 B2 | 1/2009 | Feher |
| 7,480,984 B1 | 1/2009 | Sakamoto |
| 7,506,924 B2 | 3/2009 | Bargheer et al. |
| 7,506,938 B2 | 3/2009 | Brennan et al. |
| 7,513,273 B2 | 4/2009 | Bivin |
| 7,523,617 B2 | 4/2009 | Venkatasubramanian et al. |
| 7,581,785 B2 | 9/2009 | Heckmann et al. |
| 7,587,901 B2 | 9/2009 | Petrovski |
| 7,587,902 B2 | 9/2009 | Bell |
| 7,591,507 B2 | 9/2009 | Giffin et al. |
| 7,608,777 B2 | 10/2009 | Bell et al. |
| 7,621,594 B2 | 11/2009 | Hartmann et al. |
| 7,640,754 B2 | 1/2010 | Wolas |
| 7,665,803 B2 | 2/2010 | Wolas |
| 7,708,338 B2 | 5/2010 | Wolas |
| 7,731,279 B2 | 6/2010 | Asada et al. |
| RE41,765 E | 9/2010 | Gregory et al. |
| 7,788,933 B2 | 9/2010 | Goenka |
| 7,827,620 B2 | 11/2010 | Feher |
| 7,827,805 B2 | 11/2010 | Comiskey et al. |
| 7,862,113 B2 | 1/2011 | Knoll |
| 7,866,017 B2 | 1/2011 | Knoll |
| 7,870,745 B2 | 1/2011 | Goenka |
| 7,877,827 B2 | 2/2011 | Marquette et al. |
| 7,915,516 B2 | 3/2011 | Hu |
| 7,926,293 B2 | 4/2011 | Bell |
| 7,932,460 B2 | 4/2011 | Bell |
| 7,937,789 B2 | 5/2011 | Feher |
| 7,942,010 B2 | 5/2011 | Bell |
| 7,946,120 B2 | 5/2011 | Bell |
| 7,963,594 B2 | 6/2011 | Wolas |
| 7,966,835 B2 | 6/2011 | Petrovski |
| 7,969,738 B2 | 6/2011 | Koo |
| 7,996,936 B2 | 8/2011 | Marquette et al. |
| 8,039,726 B2 | 10/2011 | Zhang et al. |
| 8,062,797 B2 | 11/2011 | Fisher et al. |
| 8,065,763 B2 | 11/2011 | Brykalski et al. |
| 8,079,223 B2 | 12/2011 | Bell |
| 8,104,295 B2 | 1/2012 | Lofy |

(56) References Cited

U.S. PATENT DOCUMENTS

| | | |
|---|---|---|
| 8,143,554 B2 | 3/2012 | Lofy |
| 8,181,290 B2 | 5/2012 | Brykalski et al. |
| 8,191,187 B2 | 6/2012 | Brykalski et al. |
| 8,198,116 B2 | 6/2012 | Chen et al. |
| 8,222,511 B2 | 7/2012 | Lofy |
| 8,256,236 B2 | 9/2012 | Lofy |
| 8,332,975 B2 | 12/2012 | Brykalski et al. |
| 8,375,728 B2 | 2/2013 | Bell |
| 8,397,518 B1 | 3/2013 | Vistakula |
| 8,402,579 B2 | 3/2013 | Marquette et al. |
| 8,418,286 B2 | 4/2013 | Brykalski et al. |
| 8,424,315 B2 | 4/2013 | Goenka |
| 8,434,314 B2 | 5/2013 | Comiskey et al. |
| 8,438,863 B2 | 5/2013 | Lofy |
| RE44,272 E | 6/2013 | Bell |
| 8,495,884 B2 | 7/2013 | Bell et al. |
| 8,505,320 B2 | 8/2013 | Lofy |
| 8,516,842 B2 | 8/2013 | Petrovski |
| 8,539,624 B2 | 9/2013 | Terech et al. |
| 8,540,466 B2 | 9/2013 | Halliar |
| 8,575,518 B2 | 11/2013 | Walsh |
| 8,614,390 B2 | 12/2013 | Watts |
| 8,621,687 B2 | 1/2014 | Brykalski et al. |
| 8,640,466 B2 | 2/2014 | Bell et al. |
| 8,646,262 B2 | 2/2014 | Magneto |
| 8,658,881 B2 | 2/2014 | Cheng et al. |
| 8,701,422 B2 | 4/2014 | Bell et al. |
| 8,729,380 B2 | 5/2014 | Stefan et al. |
| 8,732,874 B2 | 5/2014 | Brykalski et al. |
| 8,782,830 B2 | 7/2014 | Brykalski et al. |
| 8,869,596 B2 | 10/2014 | Hagl |
| 8,893,329 B2 | 11/2014 | Petrovksi |
| 8,893,513 B2 | 11/2014 | June et al. |
| 8,969,704 B2 | 3/2015 | Bruck et al. |
| 9,006,557 B2 | 4/2015 | LaGrandeur et al. |
| 9,020,572 B2 | 4/2015 | Mensinger et al. |
| 9,105,808 B2 | 8/2015 | Petrovksi |
| 9,105,809 B2 | 8/2015 | Lofy |
| 9,121,414 B2 | 9/2015 | Lofy et al. |
| 9,125,497 B2 | 9/2015 | Brykalski et al. |
| 9,178,128 B2 | 11/2015 | Jovovic et al. |
| 9,293,680 B2 | 3/2016 | Poliquin et al. |
| 9,306,143 B2 | 4/2016 | Ranalli et al. |
| 9,310,112 B2 | 4/2016 | Bell et al. |
| 9,335,073 B2 | 5/2016 | Lofy |
| 9,445,524 B2 | 9/2016 | Lofy et al. |
| 9,451,723 B2 | 9/2016 | Lofy et al. |
| 9,603,459 B2 | 3/2017 | Brykalski et al. |
| 9,651,279 B2 | 5/2017 | Lofy |
| 9,662,962 B2 | 5/2017 | Steinman et al. |
| 9,685,599 B2 | 6/2017 | Petrovski et al. |
| 9,719,701 B2 | 8/2017 | Bell et al. |
| 9,814,641 B2 | 11/2017 | Brykalski et al. |
| 9,857,107 B2 | 1/2018 | Inaba et al. |
| 9,863,672 B2 | 1/2018 | Goenka |
| 9,865,794 B2 | 1/2018 | Jovovic et al. |
| 9,989,267 B2 | 6/2018 | Brykalski et al. |
| 10,005,337 B2 | 6/2018 | Petrovski |
| 10,170,811 B2 | 1/2019 | Kossakovski et al. |
| 10,208,990 B2 | 2/2019 | Petrovski et al. |
| 10,228,166 B2 | 3/2019 | Lofy |
| 10,266,031 B2 | 4/2019 | Steinman et al. |
| 10,270,141 B2 | 4/2019 | Piggott et al. |
| 10,288,084 B2 | 5/2019 | Lofy et al. |
| 10,290,796 B2 | 5/2019 | Boukai et al. |
| 10,405,667 B2 | 9/2019 | Marquette et al. |
| 10,457,173 B2 | 10/2019 | Lofy et al. |
| 10,473,365 B2 | 11/2019 | Bell et al. |
| 10,495,322 B2 | 12/2019 | Brykalski et al. |
| 10,784,546 B2 | 9/2020 | Piggott et al. |
| 2001/0005990 A1 | 7/2001 | Kim et al. |
| 2001/0014212 A1 | 8/2001 | Rutherford |
| 2001/0028185 A1 | 10/2001 | Stowe et al. |
| 2002/0017102 A1 | 2/2002 | Bell |
| 2002/0026226 A1 | 2/2002 | Ein |
| 2002/0062854 A1 | 5/2002 | Sharp |
| 2002/0092308 A1 | 7/2002 | Bell |
| 2002/0100121 A1 | 8/2002 | Kocurek |
| 2002/0108380 A1 | 8/2002 | Nelsen et al. |
| 2002/0121094 A1 | 9/2002 | VanHoudt |
| 2002/0171132 A1 | 11/2002 | Buchwalter et al. |
| 2002/0195844 A1 | 12/2002 | Hipwell |
| 2003/0019044 A1 | 1/2003 | Larsson et al. |
| 2003/0039298 A1 | 2/2003 | Eriksson et al. |
| 2003/0041892 A1 | 3/2003 | Fleurial et al. |
| 2003/0070235 A1 | 4/2003 | Suzuki et al. |
| 2003/0084511 A1 | 5/2003 | Salvatini et al. |
| 2003/0084935 A1* | 5/2003 | Bell ............... H01L 35/32 136/200 |
| 2003/0094265 A1 | 5/2003 | Chu et al. |
| 2003/0106677 A1 | 6/2003 | Memory et al. |
| 2003/0110779 A1 | 6/2003 | Otey et al. |
| 2003/0133492 A1 | 7/2003 | Watanabe |
| 2003/0145380 A1 | 8/2003 | Schmid |
| 2003/0150060 A1 | 8/2003 | Huang |
| 2003/0160479 A1 | 8/2003 | Minuth et al. |
| 2003/0188382 A1 | 10/2003 | Klamm et al. |
| 2003/0234247 A1 | 12/2003 | Stern |
| 2004/0042181 A1 | 3/2004 | Nagasaki |
| 2004/0089336 A1 | 5/2004 | Hunt |
| 2004/0090093 A1 | 5/2004 | Kamiya et al. |
| 2004/0098991 A1 | 5/2004 | Heyes |
| 2004/0113549 A1 | 6/2004 | Roberts et al. |
| 2004/0164594 A1 | 8/2004 | Stoewe et al. |
| 2004/0177622 A1 | 9/2004 | Harvie |
| 2004/0177876 A1 | 9/2004 | Hightower |
| 2004/0177877 A1 | 9/2004 | Hightower |
| 2004/0195870 A1 | 10/2004 | Bohlender |
| 2004/0238022 A1 | 12/2004 | Hiller et al. |
| 2004/0255364 A1 | 12/2004 | Feher |
| 2004/0264009 A1 | 12/2004 | Hwang et al. |
| 2005/0000558 A1* | 1/2005 | Moriyama ............ H01L 35/32 136/205 |
| 2005/0011009 A1 | 1/2005 | Wu |
| 2005/0012204 A1 | 1/2005 | Strnad |
| 2005/0056310 A1 | 3/2005 | Shikata et al. |
| 2005/0067862 A1 | 3/2005 | Iqbal et al. |
| 2005/0072165 A1 | 4/2005 | Bell |
| 2005/0076944 A1 | 4/2005 | Kanatzidis et al. |
| 2005/0078451 A1 | 4/2005 | Sauciuc et al. |
| 2005/0086739 A1 | 4/2005 | Wu |
| 2005/0121065 A1 | 6/2005 | Otey |
| 2005/0126184 A1 | 6/2005 | Cauchy |
| 2005/0140180 A1 | 6/2005 | Hesch |
| 2005/0143797 A1 | 6/2005 | Parish et al. |
| 2005/0145285 A1 | 7/2005 | Extrand |
| 2005/0161072 A1 | 7/2005 | Esser et al. |
| 2005/0173950 A1 | 8/2005 | Bajic et al. |
| 2005/0183763 A1 | 8/2005 | Christiansen |
| 2005/0193742 A1 | 9/2005 | Arnold |
| 2005/0200166 A1 | 9/2005 | Noh |
| 2005/0202774 A1 | 9/2005 | Lipke |
| 2005/0220167 A1 | 10/2005 | Kanai et al. |
| 2005/0251120 A1 | 11/2005 | Anderson et al. |
| 2005/0257532 A1 | 11/2005 | Ikeda et al. |
| 2005/0268956 A1 | 12/2005 | Take |
| 2005/0278863 A1 | 12/2005 | Ba Hash et al. |
| 2005/0285438 A1 | 12/2005 | Ishima et al. |
| 2005/0288749 A1 | 12/2005 | Lachenbruch |
| 2006/0005548 A1 | 1/2006 | Ruckstuhl |
| 2006/0005873 A1 | 1/2006 | Kambe |
| 2006/0005944 A1 | 1/2006 | Wang et al. |
| 2006/0053529 A1 | 3/2006 | Feher |
| 2006/0075760 A1 | 4/2006 | Im et al. |
| 2006/0078319 A1 | 4/2006 | Maran |
| 2006/0080778 A1 | 4/2006 | Chambers |
| 2006/0087160 A1 | 4/2006 | Dong et al. |
| 2006/0102224 A1 | 5/2006 | Chen et al. |
| 2006/0118158 A1 | 6/2006 | Zhang et al. |
| 2006/0118159 A1 | 6/2006 | Tsuneoka et al. |
| 2006/0118160 A1 | 6/2006 | Funahashi et al. |
| 2006/0123799 A1 | 6/2006 | Tateyama et al. |
| 2006/0137099 A1 | 6/2006 | Feher |
| 2006/0137359 A1 | 6/2006 | Ghoshal |

(56) References Cited

U.S. PATENT DOCUMENTS

| | | |
|---|---|---|
| 2006/0137360 A1 | 6/2006 | Ghoshal |
| 2006/0157101 A1 | 7/2006 | Sakamoto et al. |
| 2006/0157102 A1 | 7/2006 | Nakajima et al. |
| 2006/0158011 A1 | 7/2006 | Marlovits et al. |
| 2006/0162074 A1 | 7/2006 | Bader |
| 2006/0162341 A1 | 7/2006 | Milazzo |
| 2006/0168969 A1 | 8/2006 | Mei et al. |
| 2006/0175877 A1 | 8/2006 | Alionte et al. |
| 2006/0197363 A1 | 9/2006 | Lofy et al. |
| 2006/0200398 A1 | 9/2006 | Botton et al. |
| 2006/0201161 A1 | 9/2006 | Hirai et al. |
| 2006/0201162 A1 | 9/2006 | Hsieh |
| 2006/0213682 A1 | 9/2006 | Moon et al. |
| 2006/0214480 A1 | 9/2006 | Terech |
| 2006/0219281 A1 | 10/2006 | Kuroyanagi et al. |
| 2006/0219699 A1 | 10/2006 | Geisel et al. |
| 2006/0225441 A1 | 10/2006 | Goenka et al. |
| 2006/0225773 A1 | 10/2006 | Venkatasubramanian et al. |
| 2006/0237166 A1 | 10/2006 | Otey et al. |
| 2006/0243317 A1 | 11/2006 | Venkatasubramanian |
| 2006/0244289 A1 | 11/2006 | Bedro |
| 2006/0273646 A1 | 12/2006 | Comiskey et al. |
| 2006/0289051 A1* | 12/2006 | Niimi ............ H01L 35/10 136/203 |
| 2007/0017666 A1 | 1/2007 | Goenka et al. |
| 2007/0034356 A1 | 2/2007 | Kenny et al. |
| 2007/0035162 A1 | 2/2007 | Bier et al. |
| 2007/0040421 A1 | 2/2007 | Zuzga et al. |
| 2007/0069554 A1 | 3/2007 | Comiskey et al. |
| 2007/0086757 A1 | 4/2007 | Feher |
| 2007/0089773 A1 | 4/2007 | Koester et al. |
| 2007/0095378 A1 | 5/2007 | Ito et al. |
| 2007/0095383 A1 | 5/2007 | Tajima |
| 2007/0101602 A1 | 5/2007 | Bae et al. |
| 2007/0107450 A1 | 5/2007 | Sasao et al. |
| 2007/0125413 A1 | 6/2007 | Olsen et al. |
| 2007/0138844 A1 | 6/2007 | Kim |
| 2007/0142883 A1 | 6/2007 | Quincy, III |
| 2007/0145808 A1 | 6/2007 | Minuth et al. |
| 2007/0157630 A1 | 7/2007 | Kadle et al. |
| 2007/0158981 A1 | 7/2007 | Almasi et al. |
| 2007/0163269 A1 | 7/2007 | Chung et al. |
| 2007/0190712 A1 | 8/2007 | Lin et al. |
| 2007/0193279 A1 | 8/2007 | Yoneno et al. |
| 2007/0200398 A1 | 8/2007 | Wolas et al. |
| 2007/0204850 A1 | 9/2007 | Pickard et al. |
| 2007/0214956 A1 | 9/2007 | Carlson et al. |
| 2007/0220902 A1 | 9/2007 | Matsuoka et al. |
| 2007/0220907 A1 | 9/2007 | Ehlers |
| 2007/0227158 A1 | 10/2007 | Kuchimachi |
| 2007/0234742 A1 | 10/2007 | Aoki et al. |
| 2007/0241592 A1 | 10/2007 | Giffin et al. |
| 2007/0251016 A1 | 11/2007 | Feher |
| 2007/0256722 A1 | 11/2007 | Kondoh |
| 2007/0261412 A1 | 11/2007 | Heine |
| 2007/0261413 A1 | 11/2007 | Hatamian et al. |
| 2007/0261548 A1 | 11/2007 | Vrzalik et al. |
| 2007/0261914 A1 | 11/2007 | Wahlgren et al. |
| 2007/0262621 A1 | 11/2007 | Dong et al. |
| 2007/0296251 A1 | 12/2007 | Krobok et al. |
| 2008/0000025 A1 | 1/2008 | Feher |
| 2008/0000511 A1 | 1/2008 | Kuroyanagi et al. |
| 2008/0022694 A1 | 1/2008 | Anderson et al. |
| 2008/0023056 A1 | 1/2008 | Kambe et al. |
| 2008/0028536 A1 | 2/2008 | Hadden-Cook |
| 2008/0028768 A1 | 2/2008 | Goenka |
| 2008/0028769 A1 | 2/2008 | Goenka |
| 2008/0053108 A1 | 3/2008 | Wen |
| 2008/0053509 A1 | 3/2008 | Flitsch et al. |
| 2008/0077211 A1 | 3/2008 | Levinson et al. |
| 2008/0078186 A1 | 4/2008 | Cao |
| 2008/0084095 A1 | 4/2008 | Wolas |
| 2008/0087316 A1 | 4/2008 | Inaba et al. |
| 2008/0154518 A1 | 6/2008 | Manaka et al. |
| 2008/0155990 A1 | 7/2008 | Gupta et al. |
| 2008/0163916 A1 | 7/2008 | Tsuneoka et al. |
| 2008/0164733 A1 | 7/2008 | Giffin et al. |
| 2008/0166224 A1 | 7/2008 | Giffin et al. |
| 2008/0245092 A1 | 10/2008 | Forsberg et al. |
| 2008/0263776 A1 | 10/2008 | O'Reagan |
| 2008/0289677 A1 | 11/2008 | Bell et al. |
| 2008/0307796 A1 | 12/2008 | Bell et al. |
| 2009/0000031 A1 | 1/2009 | Feher |
| 2009/0007952 A1 | 1/2009 | Kondoh et al. |
| 2009/0015042 A1 | 1/2009 | Bargheer et al. |
| 2009/0026813 A1 | 1/2009 | Lofy |
| 2009/0032080 A1 | 2/2009 | Kawauchi et al. |
| 2009/0033130 A1 | 2/2009 | Marquette et al. |
| 2009/0106907 A1 | 4/2009 | Chambers |
| 2009/0108094 A1 | 4/2009 | Ivri |
| 2009/0126110 A1 | 5/2009 | Feher |
| 2009/0178700 A1 | 7/2009 | Heremans et al. |
| 2009/0211619 A1 | 8/2009 | Sharp et al. |
| 2009/0218855 A1 | 9/2009 | Wolas |
| 2009/0235969 A1 | 9/2009 | Heremans et al. |
| 2009/0269584 A1 | 10/2009 | Bell et al. |
| 2009/0293488 A1 | 12/2009 | Coughlan, III et al. |
| 2010/0031987 A1 | 2/2010 | Bell et al. |
| 2010/0132379 A1 | 6/2010 | Wu |
| 2010/0132380 A1 | 6/2010 | Robinson, II |
| 2010/0133883 A1 | 6/2010 | Walker |
| 2010/0147351 A1 | 6/2010 | Takahashi |
| 2010/0153066 A1 | 6/2010 | Federer et al. |
| 2010/0154437 A1 | 6/2010 | Nepsha |
| 2010/0154911 A1 | 6/2010 | Yoskowitz |
| 2010/0170554 A1 | 7/2010 | Hiroyama |
| 2010/0186398 A1 | 7/2010 | Huber |
| 2010/0186399 A1 | 7/2010 | Huttinger |
| 2010/0198322 A1 | 8/2010 | Joseph et al. |
| 2010/0307168 A1 | 12/2010 | Kohl et al. |
| 2010/0326092 A1 | 12/2010 | Goenka |
| 2011/0005562 A1 | 1/2011 | Bisges |
| 2011/0066217 A1 | 3/2011 | Diller et al. |
| 2011/0101741 A1 | 5/2011 | Kolich |
| 2011/0209740 A1 | 9/2011 | Bell et al. |
| 2011/0271994 A1 | 11/2011 | Gilley |
| 2011/0289684 A1 | 12/2011 | Parish et al. |
| 2012/0000901 A1 | 1/2012 | Bajic et al. |
| 2012/0003510 A1 | 1/2012 | Eisenhour |
| 2012/0017371 A1 | 1/2012 | Pollard |
| 2012/0046823 A1 | 2/2012 | Schneider et al. |
| 2012/0080911 A1 | 4/2012 | Brykalski et al. |
| 2012/0103381 A1 | 5/2012 | Leavitt et al. |
| 2012/0111386 A1 | 5/2012 | Bell et al. |
| 2012/0132242 A1 | 5/2012 | Chu et al. |
| 2012/0160293 A1 | 6/2012 | Jinushi et al. |
| 2012/0167937 A1 | 7/2012 | Fann et al. |
| 2012/0174725 A1 | 7/2012 | Limbeck et al. |
| 2012/0174568 A1 | 7/2012 | Bruck et al. |
| 2012/0174956 A1* | 7/2012 | Smythe ............ H01L 35/32 136/230 |
| 2012/0177864 A1 | 7/2012 | Limbeck et al. |
| 2012/0198616 A1 | 8/2012 | Makansi et al. |
| 2012/0201008 A1* | 8/2012 | Hershberger ......... H05K 7/205 361/720 |
| 2012/0234078 A1 | 9/2012 | Hagl |
| 2012/0235444 A1 | 9/2012 | Dilley et al. |
| 2012/0239123 A1 | 9/2012 | Weber et al. |
| 2012/0261399 A1 | 10/2012 | Lofy |
| 2012/0289761 A1 | 11/2012 | Boyden et al. |
| 2012/0305043 A1 | 12/2012 | Kossakovski et al. |
| 2012/0325281 A1* | 12/2012 | Akiyama ............. F25B 21/02 136/200 |
| 2013/0008181 A1 | 1/2013 | Makansi et al. |
| 2013/0097777 A1 | 4/2013 | Marquette et al. |
| 2013/0125563 A1 | 5/2013 | Jun |
| 2013/0160809 A1 | 6/2013 | Mueller |
| 2013/0186448 A1 | 7/2013 | Ranalli et al. |
| 2013/0200424 A1 | 8/2013 | An et al. |
| 2013/0232996 A1 | 9/2013 | Goenka et al. |
| 2013/0239592 A1 | 9/2013 | Lofy |
| 2013/0255739 A1 | 10/2013 | Kossakovski et al. |
| 2013/0340802 A1 | 12/2013 | Jovovic et al. |
| 2014/0014871 A1 | 1/2014 | Haddon et al. |

(56) References Cited

U.S. PATENT DOCUMENTS

| | | |
|---|---|---|
| 2014/0026320 A1 | 1/2014 | Marquette et al. |
| 2014/0030082 A1 | 1/2014 | Helmenstein |
| 2014/0090513 A1 | 4/2014 | Zhang et al. |
| 2014/0096807 A1 | 4/2014 | Ranalli |
| 2014/0113536 A1 | 4/2014 | Goenka et al. |
| 2014/0131343 A1 | 5/2014 | Walsh |
| 2014/0137569 A1 | 5/2014 | Parish et al. |
| 2014/0159442 A1 | 6/2014 | Helmenstein |
| 2014/0165608 A1 | 6/2014 | Tseng |
| 2014/0180493 A1 | 6/2014 | Csonti et al. |
| 2014/0182646 A1 | 7/2014 | Choi et al. |
| 2014/0187140 A1 | 7/2014 | Lazanja et al. |
| 2014/0194959 A1 | 7/2014 | Fries et al. |
| 2014/0230455 A1 | 8/2014 | Chandler et al. |
| 2014/0250918 A1 | 9/2014 | Lofy |
| 2014/0256244 A1 | 9/2014 | Sakurai et al. |
| 2014/0260331 A1 | 9/2014 | Lofy et al. |
| 2014/0305625 A1 | 10/2014 | Petrovski |
| 2014/0338366 A1 | 11/2014 | Adldinger et al. |
| 2015/0116943 A1 | 4/2015 | Olsson et al. |
| 2015/0194590 A1 | 7/2015 | LaGrandeur |
| 2015/0231636 A1 | 8/2015 | Lim et al. |
| 2015/0238020 A1 | 8/2015 | Petrovski et al. |
| 2015/0298524 A1 | 10/2015 | Goenka |
| 2016/0030234 A1 | 2/2016 | Lofy et al. |
| 2016/0133817 A1 | 5/2016 | Makansi et al. |
| 2016/0137110 A1 | 5/2016 | Lofy et al. |
| 2016/0240585 A1 | 8/2016 | Ranalli et al. |
| 2017/0047500 A1* | 2/2017 | Shiraishi ............... H01L 35/34 |
| 2017/0066355 A1 | 3/2017 | Kozlowski |
| 2017/0071359 A1 | 3/2017 | Petrovski et al. |
| 2017/0343253 A1 | 11/2017 | Bell et al. |
| 2017/0354190 A1 | 12/2017 | Cauchy |
| 2017/0365764 A1* | 12/2017 | Shingai ................. H01L 35/10 |
| 2018/0111527 A1 | 4/2018 | Tait et al. |
| 2018/0123013 A1* | 5/2018 | Williams ............... H01L 35/04 |
| 2018/0170223 A1 | 6/2018 | Wolas |
| 2018/0172325 A1 | 6/2018 | Inaba et al. |
| 2018/0279416 A1 | 9/2018 | Sajic et al. |
| 2018/0290574 A1 | 10/2018 | Kozlowski |
| 2019/0003726 A1 | 1/2019 | Brykalski et al. |
| 2019/0252745 A1 | 8/2019 | Piggott et al. |
| 2020/0025424 A1 | 1/2020 | Cauchy |
| 2020/0035896 A1 | 1/2020 | Jovovic et al. |
| 2020/0035897 A1 | 1/2020 | Jovovic |
| 2020/0035898 A1 | 1/2020 | Jovovic et al. |
| 2020/0266327 A1 | 8/2020 | Jovovic et al. |
| 2021/0041147 A9 | 2/2021 | Cauchy |

FOREIGN PATENT DOCUMENTS

| | | |
|---|---|---|
| CN | 1295345 | 5/2001 |
| CN | 1299950 | 6/2001 |
| CN | 1320087 | 10/2001 |
| CN | 1343294 | 4/2002 |
| CN | 1929761 | 3/2007 |
| CN | 101 097 986 | 1/2008 |
| CN | 101 219 025 | 7/2008 |
| CN | 101 332 785 | 12/2008 |
| CN | 102 801 105 | 11/2012 |
| CN | 104 282 643 | 1/2015 |
| CN | 106 937 799 | 7/2017 |
| CN | 208 355 060 | 1/2019 |
| DE | 4 329 816 | 3/1994 |
| DE | 195 03 291 | 8/1996 |
| DE | 199 12 764 | 9/2000 |
| DE | 299 11 519 | 11/2000 |
| DE | 102 38 552 | 8/2001 |
| DE | 101 15 242 | 10/2002 |
| DE | 201 20 516 | 4/2003 |
| DE | 10 2009 036 332 | 2/2011 |
| DE | 10 2010 012 629 | 9/2011 |
| DE | 10 2010 035 152 | 2/2012 |
| EP | 0 272 937 | 6/1988 |
| EP | 0 424 160 | 4/1991 |
| EP | 0 411 375 | 5/1994 |
| EP | 0 621 026 | 10/1994 |
| EP | 0 834 421 | 4/1998 |
| EP | 0 862 901 | 9/1998 |
| EP | 0 878 851 | 11/1998 |
| EP | 1 174 996 | 1/2002 |
| EP | 1 324 400 | 7/2003 |
| EP | 1 475 532 | 11/2004 |
| EP | 1 515 376 | 3/2005 |
| EP | 1 598 223 | 11/2005 |
| EP | 1 744 326 | 1/2007 |
| EP | 1 780 807 | 5/2007 |
| EP | 1 906 463 | 4/2008 |
| EP | 1 972 312 | 9/2008 |
| EP | 1 845 914 | 9/2009 |
| EP | 2 159 854 | 3/2010 |
| EP | 2 275 755 | 1/2011 |
| EP | 2 378 577 | 10/2011 |
| EP | 2 439 799 | 4/2012 |
| EP | 2 541 634 | 1/2013 |
| EP | 2 396 619 | 8/2015 |
| EP | 2 921 083 | 9/2015 |
| FR | 2 543 275 | 9/1894 |
| FR | 1 280 711 | 1/1962 |
| FR | 2 261 638 | 9/1975 |
| FR | 2 316 557 | 1/1977 |
| FR | 2 419 479 | 10/1979 |
| FR | 2 481 4786 | 11/1981 |
| FR | 2 550 324 | 2/1985 |
| FR | 2 806 666 | 9/2001 |
| FR | 2 879 728 | 6/2006 |
| FR | 2 893 826 | 6/2007 |
| GB | 231 192 A | 5/1926 |
| GB | 817 077 | 7/1959 |
| GB | 874660 | 8/1961 |
| GB | 952 678 | 3/1964 |
| GB | 978057 | 12/1964 |
| GB | 1 151 947 | 5/1969 |
| GB | 2 027 534 | 2/1980 |
| GB | 2 267 338 | 12/1993 |
| GB | 2 333 352 | 7/1999 |
| JP | 45-008280 | 3/1970 |
| JP | 56-097416 | 8/1981 |
| JP | 59-097457 | 6/1984 |
| JP | 60-080044 | 5/1985 |
| JP | 60-085297 | 5/1985 |
| JP | 63-262076 | 10/1988 |
| JP | 01-131830 | 5/1989 |
| JP | 01-200122 | 8/1989 |
| JP | 01-281344 | 11/1989 |
| JP | 04-052470 | 6/1990 |
| JP | 03-102219 | 10/1991 |
| JP | 03-263382 | 11/1991 |
| JP | 04-165234 | 6/1992 |
| JP | 05-026762 | 2/1993 |
| JP | 05-277020 | 10/1993 |
| JP | 06-089955 | 3/1994 |
| JP | 06-342940 | 12/1994 |
| JP | 07-007187 | 1/1995 |
| JP | 07-198284 | 1/1995 |
| JP | 07-074397 | 3/1995 |
| JP | 07-111344 | 4/1995 |
| JP | 07-202275 | 8/1995 |
| JP | 07-226538 | 8/1995 |
| JP | 07-253264 | 10/1995 |
| JP | 08-222771 | 11/1995 |
| JP | 08-293627 | 8/1996 |
| JP | 09-042801 | 11/1996 |
| JP | 09-089284 | 2/1997 |
| JP | 09-275692 | 4/1997 |
| JP | 09-276076 | 10/1997 |
| JP | 09-321355 | 10/1997 |
| JP | 10-012935 | 12/1997 |
| JP | 10-035268 | 1/1998 |
| JP | 10-035268 | 2/1998 |
| JP | 10-044756 | 2/1998 |
| JP | 10-074986 | 3/1998 |
| JP | 10-227508 | 8/1998 |
| JP | 10-238406 | 9/1998 |

(56) References Cited

FOREIGN PATENT DOCUMENTS

| | | |
|---|---|---|
| JP | 10-275943 | 10/1998 |
| JP | 10-290590 | 10/1998 |
| JP | 10-297243 | 11/1998 |
| JP | 10-325561 | 12/1998 |
| JP | 10-332883 | 12/1998 |
| JP | 11-032492 | 2/1999 |
| JP | 11-046021 | 2/1999 |
| JP | 11-182907 | 7/1999 |
| JP | 11-201475 | 7/1999 |
| JP | 11-274574 | 10/1999 |
| JP | 11-274575 | 10/1999 |
| JP | 11-317481 | 11/1999 |
| JP | 2000-018095 | 1/2000 |
| JP | 2000-058930 | 2/2000 |
| JP | 2000-060681 | 2/2000 |
| JP | 2000-164945 | 6/2000 |
| JP | 2000-208823 | 7/2000 |
| JP | 2000-214934 | 8/2000 |
| JP | 2000-244024 | 9/2000 |
| JP | 2000-274788 | 10/2000 |
| JP | 2000-274871 | 10/2000 |
| JP | 2000-274874 | 10/2000 |
| JP | 2001-007263 | 1/2001 |
| JP | 2001-024240 | 1/2001 |
| JP | 2001-174028 | 6/2001 |
| JP | 2001-208405 | 8/2001 |
| JP | 2001-210879 | 8/2001 |
| JP | 2001-267642 | 9/2001 |
| JP | 2001-304778 | 10/2001 |
| JP | 2001-336853 | 12/2001 |
| JP | 2002-13758 | 1/2002 |
| JP | 2002-059736 | 2/2002 |
| JP | 2002-514735 | 5/2002 |
| JP | 2002-227798 | 8/2002 |
| JP | 2002-232028 | 8/2002 |
| JP | 2003-174203 | 6/2003 |
| JP | 2003-204087 | 7/2003 |
| JP | 2003-254636 | 9/2003 |
| JP | 2003-259671 | 9/2003 |
| JP | 2003-332642 | 11/2003 |
| JP | 2003-332644 | 11/2003 |
| JP | 2003-338641 | 11/2003 |
| JP | 2004-031696 | 1/2004 |
| JP | 2004-055621 | 2/2004 |
| JP | 2004-079883 | 3/2004 |
| JP | 200-174138 | 6/2004 |
| JP | 2004-360522 | 12/2004 |
| JP | 2005-079210 | 2/2005 |
| JP | 2005-237171 | 9/2005 |
| JP | 2005-251950 | 9/2005 |
| JP | 2005-294695 | 10/2005 |
| JP | 2005-303183 | 10/2005 |
| JP | 2005-317648 | 11/2005 |
| JP | 2005-333083 | 12/2005 |
| JP | 2006-001392 | 1/2006 |
| JP | 2006-021572 | 1/2006 |
| JP | 2006-076398 | 3/2006 |
| JP | 2008-274790 | 11/2008 |
| JP | 2008-300465 | 12/2008 |
| JP | 2009-010138 | 1/2009 |
| JP | 2009-033806 | 2/2009 |
| JP | 2010-034508 | 2/2010 |
| JP | 2010-108958 | 5/2010 |
| JP | 2010-182940 | 8/2010 |
| JP | 2011-077163 | 4/2011 |
| JP | 2012-522176 | 9/2012 |
| JP | 2014-135455 | 7/2014 |
| JP | 5893556 | 3/2016 |
| KR | 2001-0060500 | 7/2001 |
| KR | 10-2003-0082589 | 10/2003 |
| KR | 10-2005-0011494 | 1/2005 |
| LU | 66619 | 2/1973 |
| RU | 2 142 178 | 11/1999 |
| RU | 2 154 875 | 8/2000 |
| RU | 2562507 | 9/2015 |
| SE | 329 870 | 10/1970 |
| SE | 337 227 | 5/1971 |
| SU | 184886 | 7/1966 |
| SU | 1142711 | 2/1985 |
| SU | 1170234 A | 7/1985 |
| WO | WO 94/01893 | 1/1994 |
| WO | WO 94/020801 | 9/1994 |
| WO | WO 95/014899 | 6/1995 |
| WO | WO 95/031688 | 11/1995 |
| WO | WO 96/005475 | 2/1996 |
| WO | WO 97/22486 | 6/1997 |
| WO | WO 97/47930 | 12/1997 |
| WO | WO 98/007898 | 2/1998 |
| WO | WO 98/031311 | 7/1998 |
| WO | WO 98/034451 | 8/1998 |
| WO | WO 98/56047 | 12/1998 |
| WO | WO 99/10191 | 3/1999 |
| WO | WO 99/13511 | 3/1999 |
| WO | WO 99/023980 | 5/1999 |
| WO | WO 99/34451 | 7/1999 |
| WO | WO 99/044552 | 9/1999 |
| WO | WO 99/058907 | 11/1999 |
| WO | WO 01/52332 | 7/2001 |
| WO | WO 01/63674 | 8/2001 |
| WO | WO 02/011968 | 2/2002 |
| WO | WO 02/053400 | 7/2002 |
| WO | WO 02/058165 | 7/2002 |
| WO | WO 02/065029 | 8/2002 |
| WO | WO 02/065030 | 8/2002 |
| WO | WO 02/081982 | 10/2002 |
| WO | WO 03/014634 | 2/2003 |
| WO | WO 03/051666 | 6/2003 |
| WO | WO 03/063257 | 7/2003 |
| WO | WO 03/074951 | 9/2003 |
| WO | WO 03/090286 | 10/2003 |
| WO | WO 2004/011861 | 2/2004 |
| WO | WO 2004/019379 | 3/2004 |
| WO | WO 2004/026757 | 4/2004 |
| WO | WO 2005/023571 | 3/2005 |
| WO | WO 2005/115794 | 12/2005 |
| WO | WO 2006/001827 | 1/2006 |
| WO | WO 2006/037178 | 4/2006 |
| WO | WO 2006/041935 | 4/2006 |
| WO | WO 2006/064432 | 6/2006 |
| WO | WO 2006/078394 | 7/2006 |
| WO | WO 2006/102509 | 9/2006 |
| WO | WO 2007/060371 | 5/2007 |
| WO | WO 2007/089789 | 8/2007 |
| WO | WO 2007/097059 | 8/2007 |
| WO | WO 2007/109368 | 9/2007 |
| WO | WO 2008/013946 | 1/2008 |
| WO | WO 2008/023942 | 2/2008 |
| WO | WO 2008/025707 | 3/2008 |
| WO | WO 2008/045964 | 4/2008 |
| WO | WO 2008/046110 | 4/2008 |
| WO | WO 2008/057962 | 5/2008 |
| WO | WO 2008/076588 | 6/2008 |
| WO | WO 2008/086499 | 7/2008 |
| WO | WO 2008/091293 | 7/2008 |
| WO | WO 2008/115831 | 9/2008 |
| WO | WO 2009/015235 | 1/2009 |
| WO | WO 2009/036077 | 3/2009 |
| WO | WO 2009/097572 | 8/2009 |
| WO | WO 2010/009422 | 1/2010 |
| WO | WO 2010/088405 | 8/2010 |
| WO | WO 2010/0112961 | 10/2010 |
| WO | WO 2010/129803 | 11/2010 |
| WO | WO 2011/011795 | 1/2011 |
| WO | WO 2011/026040 | 3/2011 |
| WO | WO 2011/156643 | 12/2011 |
| WO | WO 2012/022684 | 2/2012 |
| WO | WO 2012/031980 | 3/2012 |
| WO | WO 2012/045542 | 4/2012 |
| WO | WO 2012/061763 | 5/2012 |
| WO | WO 2012/061777 | 5/2012 |
| WO | WO 2012/170443 | 12/2012 |
| WO | WO 2013/052823 | 4/2013 |
| WO | WO 2013/074967 | 5/2013 |
| WO | WO 2014/055447 | 4/2014 |

(56) References Cited

FOREIGN PATENT DOCUMENTS

| WO | WO 2014/120688 | 8/2014 |
|---|---|---|
| WO | WO 2014/164887 | 10/2014 |
| WO | WO 2016/077843 | 5/2016 |
| WO | WO 2017/059256 | 4/2017 |
| WO | WO 2017/066261 | 4/2017 |
| WO | WO 2017/100718 | 6/2017 |
| WO | WO 2017/136793 | 8/2017 |
| WO | WO 2018/175506 | 9/2018 |
| WO | WO 2019/173553 | 9/2019 |
| WO | WO 2020/112902 | 6/2020 |
| WO | WO 2020/172255 | 8/2020 |
| WO | WO 2020/180632 | 9/2020 |
| WO | WO 2021/025663 | 2/2021 |

OTHER PUBLICATIONS

U.S. Appl. No. 15/685,915, filed Aug. 24, 2017, Petrovski et al.
U.S. Appl. No. 16/277,765, filed Feb. 15, 2019, Petrovski et al.
U.S. Appl. No. 16/377,091, filed Apr. 5, 2019, Jovovic et al.
U.S. Appl. No. 16/377,109, filed Apr. 5, 2019, Jovovic.
U.S. Appl. No. 16/377,125, filed Apr. 5, 2019, Jovovic et al.
Feher, Steve, "Thermoelectric Air Conditioned Variable Temperature Seat (VTS) & Effect Upon Vehicle Occupant Comfort, Vehicle Energy Efficiency, and Vehicle Environment Compatibility", SAE Technical Paper, Apr. 1993, pp. 341-349.
Lofy et al., "Thermoelectrics for Environmental Control in Automobiles", Proceeding of Twenty-First International Conference on Thermoelectrics (ICT 2002), 2002, pp. 471-476.
Luo, Zhaoxia, "A Simple Method to Estimate the Physical Characteristics of a Thermoelectric Cooler from Vendor Datasheets", Electronics Cooling, Aug. 2008, in 17 pages from https://www.electronics-cooling.com/2008/08/a-simple-method-to-estimate-the-physical-characteristics-of-a-thermoelectric-cooler-from-vendor-datasheets/.
Photographs and accompanying description of climate control seat assembly system components publicly disclosed as early as Jan. 1998.
Photographs and accompanying description of a component of a climate control seat assembly system sold prior to Nov. 1, 2005.
Photographs and accompanying description of a component of a climate control seat assembly system sold prior to Dec. 20, 2003.
U.S. Appl. No. 15/042,846, filed Feb. 12, 2016.
Derwent-ACC-No. 1998-283540, Kwon, H et al., Hyundai Motor Co., corresponding to KR 97026106 A, published Jun. 24, 1997 (2 pages).
Diller, R. W., et al., "Experimental results confirming improved performance of systems using thermal isolation" Thermoelectrics, 2002. Proceedings ICT '02. Twenty-First International Conference on Aug. 25-29, 2002, Piscataway, NJ USA, IEEE, Aug. 25, 2002 (Aug. 25, 2002), pp. 548-550, XP010637541 ISBN: 0-7803-7683-8.
Diller, R.W., et al., "Experimental Results Confirming Improved Efficiency of Thermoelectric Power Generation Systems with Alternate Thermodynamic Cycles," 22nd International Conference on Thermoelectrics, 2003, pp. 571-573.
Funahashi et al., "Preparation and properties of thermoelectric pipe-type modules", ICT 25th International Conference on Aug. 6-10, 2006, Thermoelectrics, 2006, pp. 58-61.
Hendricks, Terry et al., "Advanced Thermoelectric Power System Investigations for Light-Duty and Heavy Duty Applications," National Renewable Energy Laboratory, Center for Transportation Technology & Systems, Colorado, Proc. 21st Int'l Cont. On Thermoelectrics, Aug. 2002, pp. 381-386.
Hsu, Kuei Fang et al., Cubic AgPbmSbTe2+m: Bulk Thermoelectric Materials with High Figure of Merit, Science, Feb. 6, 2004, p. 818-821, vol. 303.
Kambe et al., "Encapsulated Thermoelectric Modules and Compliant Pads for Advanced Thermoelectric Systems," J. Electronic Materials, vol. 39, No. 9, 1418-21 (2010).
Lofy, John et al., "Thermoelectrics for Environmental Control Automobiles," 21st International Conference on Thermoelectronics, 2002, p. 471-476.
Menchen, et al., "Thermoelectric Conversion to Recover Heavy Duty Diesel Exhaust Energy", Proceedings of the Annual Automotive Technology Development Contractors Meeting, pp. 445-449, Apr. 1991.
Min et al.,"Ring-structured thermoelectric module," Semiconductor Science and Technology, Semicond. Sci. Technol. 22 (2007) 880-8.
Miner, A., et al."Thermo-Electro-Mechanical Refrigeration Based on Transient Thermoelectric Effects", Physics letters, vol. 75, pp. 1176-1178 (1999).
Snyder, G. Jeffrey, et al., "Complex thermoelectric materials," Nature Materials, vol. 7, Feb. 2008, pp. 105-114.
Snyder, G. Jeffrey, et al., "Thermoelectric Efficiency and Compatibility," The American Physical Society, Oct. 2, 2003, vol. 91, No. 14.
Snyder, G. Jeffrey: "Application of the compatibility factor to the design of segmented and cascaded thermoelectric generators", Applied Physics Letters, AIP, American Institute of Physics, Melville, NY, vol. 84, No. 13, Mar. 29, 2004 (Mar. 29, 2004), pp. 2436-2438, XP012060957 ISSN: 0003-6951.
Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).
Tech Briefs, "Nickel-Graphite Composite Compliant Interface and/or Hot Shoe Material," article dated Sep. 1, 2013. From http://www.techbriefs.com/legal-footer-127/50-ntb/tech-briefs/materials52/17192-npo-48621 on Feb. 17, 2015.
Thermoelectrics Handbook: Macro to Nano, Thermoelectric Module Design Theories, 11.7 Ring-Structure Module, pp. 11-11 to 11-15. CRC Press, 2006.

\* cited by examiner

US 11,075,331 B2

1

THERMOELECTRIC DEVICE HAVING CIRCUITRY WITH STRUCTURAL RIGIDITY

INCORPORATION BY REFERENCE TO ANY PRIORITY APPLICATIONS

Any and all applications for which a foreign or domestic priority claim is identified in the Application Data Sheet as filed with the present application are incorporated by reference and made a part of this specification.

BACKGROUND

Field

This application relates to thermoelectric devices and modules used for thermal management of components and/or systems, including but not limited to batteries.

Description of the Related Art

Power electronics and other electrical devices, such as batteries, can be sensitive to overheating, cold temperatures, extreme temperatures, and operating temperature limits. The performance of such devices may be diminished, sometimes severely, when the devices are operated outside of recommended temperature ranges. In semiconductor devices, integrated circuit dies can overheat and malfunction. In batteries, including, for example, batteries used for automotive applications in electrified or electrical vehicles, battery cells and their components can degrade when overheated or overcooled. Such degradation can manifest itself in reduced battery storage capacity and/or reduced ability for the battery to be recharged over multiple duty cycles. Furthermore, high performance batteries for use in large systems (including, for example, lithium based batteries used in electrical vehicles) have certain properties (e.g., charging characteristics) and/or safety-related events (e.g., potential fires due to over-temperature conditions) that make thermal management of the batteries and/or containment system desirable.

SUMMARY

In certain embodiments, a thermoelectric device is provided. The thermoelectric device comprises a thermally conductive first plate and at least one thermoelectric sub-assembly. The first plate comprises a layer comprising a plurality of electrically conductive first portions and a plurality of electrically insulating second portions separating the first portions from one another. The at least one thermoelectric sub-assembly comprises a thermally conductive second plate and a plurality of thermoelectric elements in a region between the first plate and the second plate. The plurality of thermoelectric elements is in electrical communication with the plurality of electrically conductive portions of the first plate, in electrical communication with electrically conductive portions of the second plate, and in thermal communication with the first plate and the second plate. The plurality of electrically insulating second portions comprises a plurality of segments at least partially outside the region, the segments configured to avoid degradation of a structural rigidity of the first plate.

In certain embodiments, a thermoelectric module for thermally conditioning a component is provided. The module comprises first and second heat spreaders spaced apart from one another and configured to respectively provide cold and hot sides and to be mechanically coupled together by at least one fastener. The module further comprises a material arranged between the first and second heat spreaders. The module further comprises a thermoelectric device operatively engaged with the first and second heat spreaders. The thermoelectric device comprises a thermally conductive first plate and at least one thermoelectric sub-assembly. The first plate comprises a layer comprising a plurality of electrically conductive first portions and a plurality of electrically insulating second portions separating the first portions from one another. The at least one thermoelectric sub-assembly comprises a thermally conductive second plate and a plurality of thermoelectric elements in a region between the first plate and the second plate. The plurality of thermoelectric elements is in electrical communication with the plurality of electrically conductive portions of the first plate, in electrical communication with electrically conductive portions of the second plate, and in thermal communication with the first plate and the second plate. The plurality of electrically insulating second portions comprises a plurality of segments at least partially outside the region, the segments configured to avoid degradation of a structural rigidity of the first plate.

In certain embodiments, a method of fabricating a thermoelectric device is provided. The method comprises providing a first plate comprising a plurality of electrically conductive first portions and a plurality of electrically insulating second portions separating the first portions from one another. The method further comprises providing a second plate comprising a plurality of electrically conductive portions of the second plate. The method further comprises connecting a plurality of thermoelectric elements to the plurality of electrically conductive first portions of the first plate and to the plurality of electrically conductive portions of the second plate. The plurality of thermoelectric elements is in a region between the first plate and the second plate and is in thermal communication with the first plate and with the second plate. The plurality of electrically insulating second portions comprises a plurality of segments at least partially outside the region, the segments configured to avoid degradation of a structural rigidity of the first plate.

In certain embodiments, a thermoelectric device includes a first Peltier circuit and a second Peltier circuit both on a first substrate of the thermoelectric device, the first substrate having structural rigidity between the first and second Peltier circuits. The thermoelectric device can include one or more: a first substrate comprising a first surface; a second substrate comprising a second surface, the second surface facing the first surface and spaced apart from the first surface to form a first gap; a third substrate comprising a third surface, the third surface facing the first surface and spaced apart from the first surface to form a second gap, the third substrate spaced apart from the second substrate to form a third gap along a portion of the first substrate between the second and third substrates; a first plurality of semiconductor elements disposed between the first and second substrates within the first gap, the first plurality of semiconductor elements comprising N-type semiconductor elements and P-type semiconductor elements; a first layout of etching in the first substrate to form a first set of electrical conductors in the first substrate, the first set of electrical conductors connected to the first plurality of semiconductor elements, the first layout of etching extending into the portion of the first surface between the second and third substrates in a first arrangement configured to provide structural rigidity to the first substrate in the portion of the first substrate between the second and third substrates; a second layout of etching in the second substrate to form a second set of electrical conductors in the second substrate, wherein the first set of electrical conductors and the second set of electrical conductors electrically connect the N-type and P-type semiconductor elements of the first plurality of semiconductor elements to form a first Peltier circuit; a second plurality of semiconductor elements disposed between the first and third substrates within the second gap, the second plurality of semiconductor elements comprising N-type semiconductor elements and P-type semiconductor elements; a third layout of etching in the first substrate to form a third set of electrical conductors in the first substrate, the third set of electrical conductors connected to the second plurality of semiconductor elements, the third layout of etching extending into the portion of the first surface between the second and third substrates in a second arrangement configured to provide structural rigidity to the first substrate in the portion of the first substrate between the second and third substrates; a fourth layout of etching in the third substrate to form a fourth set of electrical conductors in the third substrate; wherein the third set of electrical conductors and the fourth set of electrical conductors electrically connect the N-type and P-type semiconductor elements of the second plurality of semiconductor elements to form a second Peltier circuit; and/or wherein the first and second arrangements of etching are configured to provide structural rigidity by resisting bending of the portion of the first substrate between the second and third substrates.

In certain embodiments, the thermoelectric device can include one or more: wherein the first and second arrangements of etching are substantially the same; wherein the first and second arrangements of etching comprise a serpentine or zigzag pattern; wherein the first and second layouts of etching comprise a rectangular pattern forming at least in part the first and third set of electrical conductors, and wherein the serpentine or zigzag pattern extends at least partly from the rectangular pattern; wherein the first and second arrangements of etching do not include etching that forms a straight line extending along a periphery of the second substrate or the third substrate in the portion of the first substrate; wherein the second and third substrates each comprise a periphery, and wherein the first and second arrangements of etching are formed in the first substrate at least partly between the peripheries of the second and third substrates; wherein at least a part of the portion of the first substrate electrically connects the first and third set of electrical conductors of the first substrate to electrically connect the first and second Peltier circuits; wherein the first substrate comprises an etch line in the portion of the first substrate that electrically insulates at least an other part of the portion of the first substrate from the at least a part of the portion of the first substrate; wherein the first substrate comprises three layers of material, the first and third layouts of etching formed in the first substrate by removal of a first layer of the three layers from the first substrate to form the first and third set of electrical conductors from the first layer; wherein the three layers of material of the first substrate comprise a first metallic layer, a second polymer layer on the first metallic layer, and a third metallic layer on the second polymer layer; wherein the first and third metallic layers comprise copper, and the second polymer layer comprises epoxy; and/or wherein the first substrate comprises a solder mask positioned in at least the etching of the first substrate to provide electrical insulation between the first and third set of electrical conductors.

In certain embodiments, a substrate for a thermoelectric device has a first Peltier circuit and a second Peltier circuit both on the substrate, the substrate having structural rigidity between the first and second Peltier circuits. The substrate can include one or more: a first layout of etching in the substrate to form a first set of electrical conductors in the substrate, the first set of electrical conductors connected to a first plurality of semiconductor elements to form at least in part a first Peltier circuit; a second layout of etching in the substrate to form a second set of electrical conductors in the substrate, the second set of electrical conductors connected to a second plurality of semiconductor elements to form at least in part a second Peltier circuit; a portion of the substrate separating the first Peltier circuit from the second Peltier circuit; and/or wherein the first layout of etching extends into the portion of the substrate between the first and second Peltier circuits in a first arrangement configured to provide structural rigidity to the substrate in the portion of the substrate between the first and second Peltier circuits by resisting bending of the portion of the substrate between the first and second Peltier circuits.

In certain embodiments, the substrate can include one or more: wherein the second layout of etching extends into the portion of the substrate between the first and second Peltier circuits in a second arrangement configured to provide structural rigidity to the substrate in the portion of the substrate between the first and second Peltier circuits by resisting bending of the portion of the substrate between the first and second Peltier circuits; wherein the first and second arrangements of etching are substantially the same; wherein the first arrangement of etching comprises a serpentine or zigzag pattern; wherein the first layout of etching comprises a rectangular pattern forming at least in part the first set of electrical conductors, and wherein the serpentine or zigzag pattern extends at least partly from the rectangular pattern; wherein the first arrangement of etching does not include etching that forms a straight line extending along a periphery of the first Peltier circuit in the portion of the substrate; wherein the first and second Peltier circuits comprise a periphery, and wherein the first arrangement of etching are formed in the first substrate at least partly between the peripheries of the first and second Peltier circuits; wherein at least a part of the portion of the substrate electrically connects the first and second set of electrical conductors to electrically connect the first and second Peltier circuits; wherein an etch line in the portion of the substrate electrically insulates at least an other part of the portion of the substrate from the at least a part of the portion of the substrate; further comprising three layers of material, the first and second layouts of etching formed in the substrate by removal of a first layer of the three layers from the substrate to form the first and second set of electrical conductors from the first layer; wherein the three layers of material comprise a first metallic layer, a second polymer layer on the first metallic layer, and a third metallic layer on the second polymer layer; wherein the first and third metallic layers comprise copper, and the second polymer layer comprises epoxy; further comprising a solder mask positioned in the first and second layouts of etching to provide electrical insulation between the first and second set of electrical conductors; and/or wherein both the first and second Peltier circuits each include an other substrate connected to the first and second set of electrical conductors, respectively, the other substrates of the first and second Peltier circuits each including electrical conductors to form the first and second Peltier circuits.

In certain embodiments, provided is a method of manufacturing a thermoelectric device including a first plurality of semiconductor elements and a second plurality of semiconductor elements both on a first substrate of the thermoelectric device, the first substrate having structural rigidity between the first and second plurality of semiconductor elements. The method can include one or more: etching a first layout in a first substrate to form a first set of electrical conductors in the first substrate; etching a second layout in the first substrate to form a second set of electrical conductors in the first substrate; etching a third layout in a second substrate to form a third set of electrical conductors in the second substrate; etching a fourth layout in a third substrate to form a fourth set of electrical conductors in the third substrate; electrically connecting a first plurality of semiconductor elements to the first and third set of electrical conductors of the first and second substrates, the first plurality of semiconductor elements comprising N-type semiconductor elements and P-type semiconductor elements; electrically connecting a second plurality of semiconductor elements to the second and fourth set of electrical conductors of the first and third substrates, the second plurality of semiconductor elements comprising N-type semiconductor elements and P-type semiconductor elements; wherein the first layout of etching extends into a portion of the first substrate between the second and third substrates in a first arrangement configured to provide structural rigidity to the first substrate in the portion of the first substrate between the second and third substrates; wherein the second layout of etching extends into the portion of the first substrate between the second and third substrates in a second arrangement configured to provide structural rigidity to the first substrate in the portion of the first substrate between the second and third substrates; and/or wherein the first and second arrangements of etching are configured to provide structural rigidity by resisting bending of the portion of the first substrate between the second and third substrates.

In certain embodiments, the method can include one or more: etching the portion of the first substrate to electrically insulate at least a part of the portion of the first substrate from at least an other part of the first substrate, the at least a part of the first substrate electrically connecting the first and second set of electrical conductors; applying a solder mask on at least the etching of the first substrate to provide electrical insulation between the first and second set of electrical conductors; wherein the first and second arrangements of etching are substantially the same; wherein the first and second arrangements of etching comprise a serpentine or zigzag pattern; wherein the first and second layouts of etching comprise a rectangular pattern forming at least in part the first and second set of electrical conductors, and wherein the serpentine or zigzag pattern extends at least partly from the rectangular pattern; wherein the first and second arrangements of etching do not include etching that forms a straight line extending along a periphery of the second substrate or the third substrate in the portion of the first substrate; wherein the second and third substrates each comprise a periphery, and wherein the first and second arrangements are etched in the first substrate at least partly between the peripheries of the second and third substrates; wherein the first substrate comprises three layers of material, the first and third layout of etching formed in the first substrate by removal of a first layer of the three layers from the first substrate to form the first and second set of electrical conductors from the first layer; wherein the three layers of material of the first substrate comprise a first metallic layer, a second polymer layer on the first metallic layer, and a third metallic layer on the second polymer layer; and/or wherein the first and third metallic layers comprise copper, and the second polymer layer comprises epoxy.

DETAILED DESCRIPTION

Figure 1A:
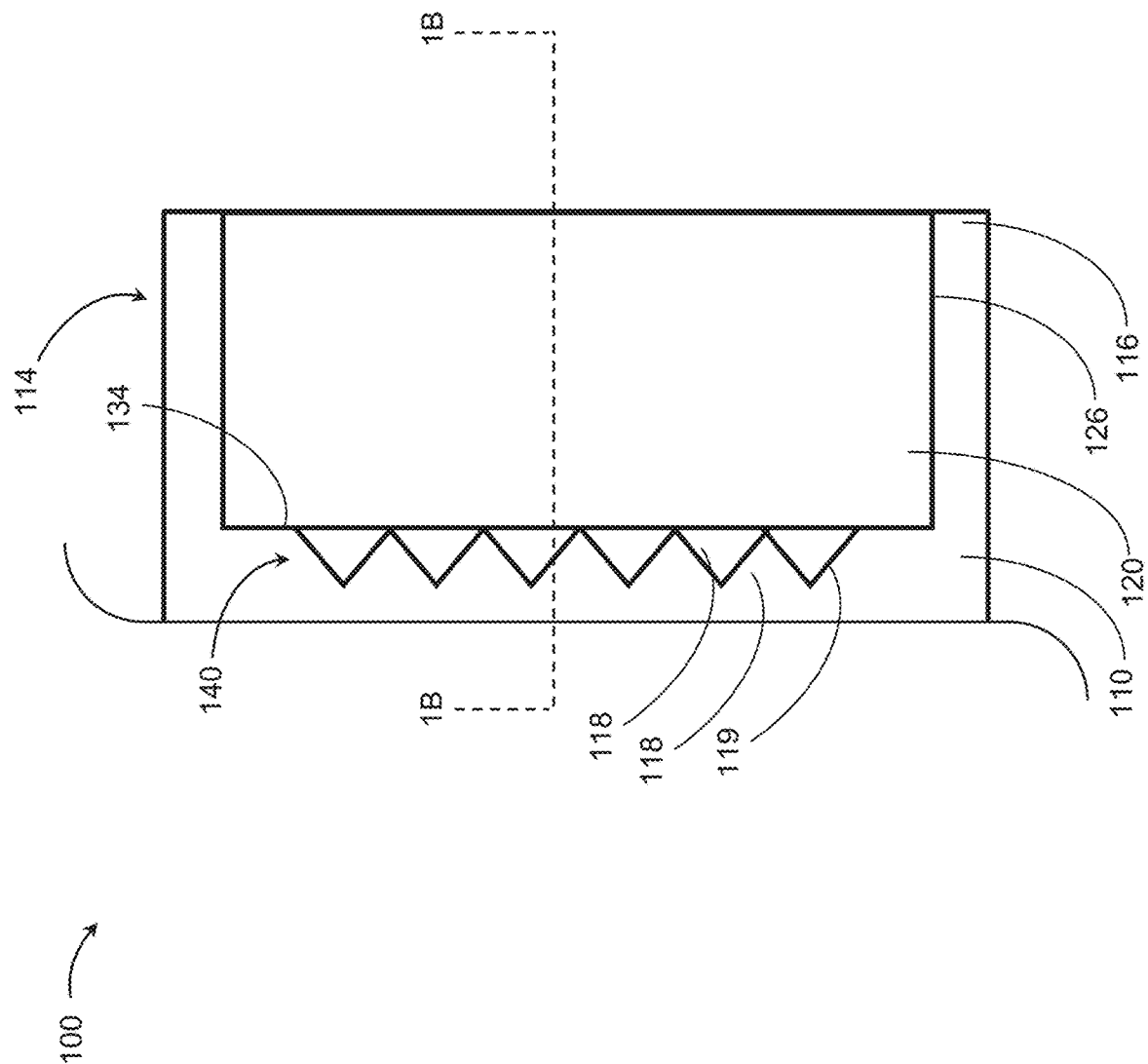
FIG. 1A schematically illustrates a top view of an example thermoelectric device in accordance with certain embodiments described herein.
Figure 1B:
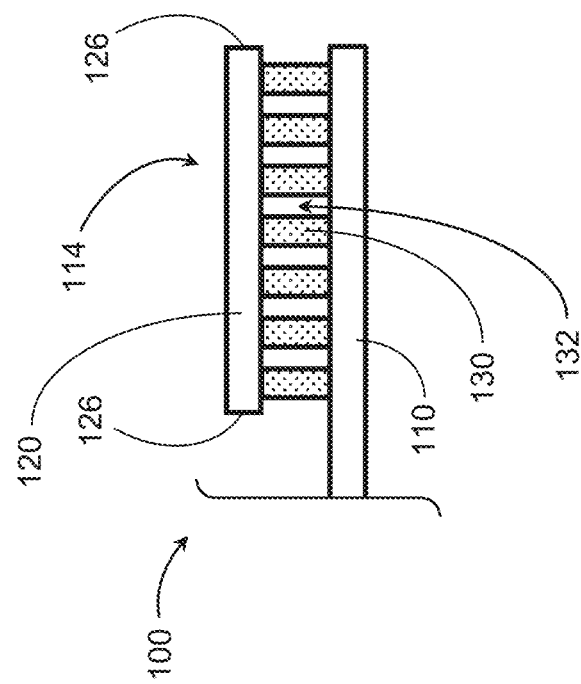
FIG. 1B schematically illustrates a cross-sectional view of the example thermoelectric device of FIG. 1A.
Figure 1C:
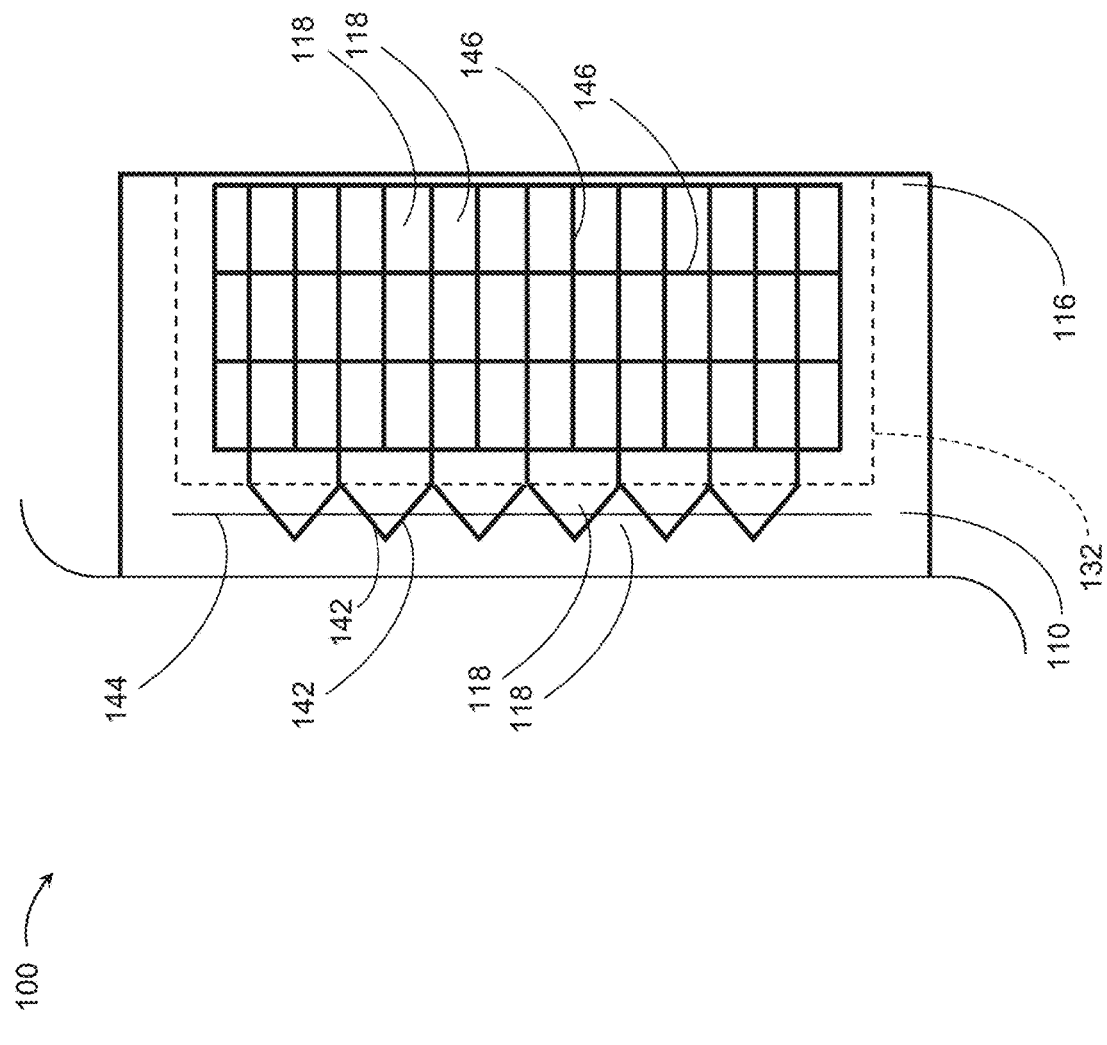
FIG. 1C schematically illustrates a top view of an example first plate in accordance with certain embodiments described herein.

FIG. 1A schematically illustrates a top view of an example thermoelectric device 100 in accordance with certain embodiments described herein. FIG. 1B schematically illustrates a cross-sectional view of the example thermoelectric device 100 of FIG. 1A. FIG. 1C schematically illustrates a top view of an example first plate 110 in accordance with certain embodiments described herein.

The thermoelectric device 100 of FIGS. 1A-1B comprises a thermally conductive first plate 110 and at least one thermoelectric sub-assembly 114 comprising a thermally conductive second plate 120 and a plurality of thermoelectric ("TE") elements 130. As shown schematically in FIGS. 1A and 1C, the first plate 110 comprises a layer 116 comprising a plurality of electrically conductive first portions 118 and a plurality of electrically insulating second portions 119 separating the first portions 118 from one another. The plurality of TE elements 130 is in a region 132 bounded by and including (e.g., between) the first plate 110 and the second plate 120 and is in electrical communication with the plurality of electrically conductive portions 118 of the first plate 110, in electrical communication with electrical conductive portions (not shown) of the second plate 120, and in thermal communication with the first plate 110 and the second plate 120. The plurality of electrically insulating second portions 119 comprises a plurality of segments 140 that are at least partially outside the region 132. The segments 140 are configured to provide structural rigidity to the first plate 110 by resisting bending of the first plate 110.

In certain embodiments, each of the first plate 110 and the second plate 120 comprises a planar laminate structure (e.g., a printed circuit board or PCB) having one or more electrically conductive layers (e.g., copper; aluminum; metal; metal alloy or composite) and one or more electrically insulating layers (e.g., fiberglass; resin; polymer; fibrous material preimpregnated with a resin material such as epoxy). The one or more electrically conductive layers can be configured to provide electrical connections to the plurality of TE elements 130. For example, the layer 116 can comprises an electrically conductive layer of the first plate 110 wherein at least some of the electrically conductive portions 118 comprise electrically conductive pads on a surface of the first plate 110 in the region 132. The pads can be configured to be coupled (e.g., soldered) to the TE elements 130, and the pads can be in electrical communication with other pads of the first plate 110 (e.g., by electrically conductive lines formed by selective chemical etching of the electrically conductive layers and by electrically conductive vias formed through the electrically insulating layers). Similarly, at least some portions of an electrically conductive layer of the second plate 120 can comprise electrically conductive pads on a surface of the second plate 120 in the region 132 which are configured to be coupled (e.g., soldered) to the TE elements 130, and the pads can be in electrical communication with other pads of the second plate 120 (e.g., by electrically conductive lines formed by selective chemical etching of the electrically conductive layers and by electrically conductive vias formed through the electrically insulating layers).

In certain embodiments, the first plate 110 has a planar parallelogram shape (e.g., rhombus shape; rectangular shape; square shape) with four edges (e.g., a rectangular shape with two shorter edges and two longer edges). The first plate 110 can have other planar shapes (e.g., polygonal) with other numbers of edges in accordance with certain embodiments described herein (e.g., triangular shapes with three edges; trapezoidal shapes with four edges; pentagonal shapes with five edges; hexagonal shapes with six edges; etc.). In certain embodiments, the second plate 120 has a planar parallelogram shape (e.g., rhombus shape; rectangular shape; square shape) with four edges 126 (e.g., a rectangular shape with two shorter edges and two longer edges). The second plate 120 can have other planar shapes (e.g., polygonal) with other numbers of edges 126 in accordance with certain embodiments described herein (e.g., triangular shapes with three edges; trapezoidal shapes with four edges; pentagonal shapes with five edges; hexagonal shapes with six edges; etc.).

In certain embodiments, the plurality of TE elements 130 comprises p-type TE elements and n-type TE elements in electrical communication with one another through a plurality of shunts (e.g., electrically conductive pads of the first plate 110 and the second plate 120). For example, the plurality of TE elements 130 can be arranged in a "stonehenge" configuration in which p-type and n-type TE elements alternate with one another and are in series electrical communication with one another by shunts which are alternately positioned on the first plate 110 and the second plate 120 such that electrical current can flow serially through the TE elements 130 and the shunts in a serpentine fashion. In certain embodiments, the plurality of TE elements 130 are in thermal communication with the first plate 110 through the shunts (e.g., electrically conductive pads) on the surface of the first plate 110 and in thermal communication with the second plate 120 through the shunts (e.g., electrically conductive pads) on the surface of the second plate 120. In certain embodiments, the region 132 containing the plurality of TE elements 130 is bounded by and includes (e.g., between) the first plate 110 and the second plate 120 and has a perimeter 134 defined by the second plate 120 (e.g., the perimeter 134 is coincident with the plurality of edges 126 of the second plate 120).

In certain embodiments, a top surface of the first plate 110 (e.g., a surface of the first plate 110 closest to the second plate 120) has a first surface area and a top surface of the second plate 120 (e.g., a surface of the second plate 120 farthest from the first plate 110) has a second surface area less than the first surface area. For example, the thermoelectric device 100 can comprise a plurality of thermoelectric sub-assemblies 114, each comprising a corresponding second plate 120 and a corresponding plurality of TE elements 130 (e.g., the plurality of second plates 120 are mounted to a common first plate 110), and the first plate 110 can have a surface area larger than the sum of the surface areas of the second plates 120. In certain embodiments, the first plate 110 and the second plate 120 are spaced from one another by a gap having a gap height. For example, the gap between the top surface of the first plate 110 and a bottom surface of the second plate 120 (e.g., a surface of the second plate 120 closest to the first plate 110) is equal to the height of the TE elements 130 within the region 132, as schematically illustrated by FIG. 1B.

In certain embodiments, the plurality of electrically conductive first portions 118 of the layer 116 comprises an electrically conductive material, examples of which include but are not limited to: copper; aluminum; metal; metal alloy or composite, and the plurality of electrically insulating second portions 119 of the layer 116 does not contain an electrically conductive material. For example, the layer 116 can comprise a copper layer from which some of the copper has been removed (e.g., etched) such that the electrically conductive first portions 118 comprise copper remaining after this removal (e.g., etching) from the layer 116, and the electrically insulating second portions 119 comprise portions of the layer 116 from which the electrically conductive material (e.g., copper) has been removed (e.g., etched), so the second portions 119 comprise etched portions of the layer 116.

In certain embodiments, the plurality of segments 140 that are at least partially outside the region 132 comprise linear segments 142 extending across a straight line 144 that is spaced away from the region 132 in a direction perpendicular to the line 144. For example, as schematically illustrated in FIG. 1C, the linear segments 142 extend across (e.g., back and forth) a line 144 that is spaced away from the region 132 in a direction perpendicular to the line 144. The linear segments 142 can be arranged in at least one serpentine or zigzag pattern. The plurality of electrically insulating second portions 119 of certain embodiments further comprises a plurality of second segments 146 in the region 132. For example, as schematically illustrated in FIG. 1C, the second segments 146 can comprise straight linear segments that are arranged in a rectangular pattern separating the electrically conductive first portions 118 within the region 132 from one another, with at least some of the linear segments 142 extending at least partly from the rectangular pattern of the linear second segments 146.

The plurality of segments 140 of FIGS. 1A and 1C are straight and are arranged in a triangular zigzag pattern, while certain other embodiments have a plurality of segments 140 with other configurations and in other serpentine or zigzag patterns. FIGS. 2A-2D schematically illustrate other example pluralities of segments 140 in accordance with certain embodiments described herein. For example, the plurality of segments 140 of FIG. 2A comprise curved linear segments 148 which extend across the line 144, the plurality of segments 140 of FIG. 2B comprise straight linear segments 142 that extend across the line 144 and other straight linear segments 143 that extend along the line 144, the plurality of segments 140 of FIG. 2C comprise straight linear segments 142 that extend across the line 144 in a triangular pattern with different lengths from the segments 140 of FIGS. 1A and 1C, and the plurality of segments 140 of FIG. 2D comprise some straight linear segments 142 that extend across the line 144 and some curved linear segments 148 that extend across the line 144. Various other segments 140 having other shapes and/or arranged in other orientations, configurations, and/or patterns are also compatible with certain embodiments described herein.

In certain embodiments, the plurality of segments 140 are configured to avoid (e.g., reduce; prevent; inhibit; minimize) degradation of a structural rigidity (e.g., a resistance to bending) of the first plate 110 by avoiding having the segments 140 outside the region 132 operate as a "scored line" which would allow bending of the first plate 110 to occur more easily (e.g., with less force than if the segments 140 did not exist). Such avoidance of degradation of the structural rigidity can be provided by the plurality of segments 140 not including a straight linear segment that is longer than a predetermined length. For example, the first plate 110 can have a length L in a first direction and a width W in a second direction perpendicular to the first direction, and the plurality of segments 140 does not include a straight linear segment extending along the first direction a distance longer than 50% of the length L or extending along the second direction a distance longer than 50% of the width W. For another example, the plurality of segments 140 comprises straight linear segments each extending along the first direction a distance less than 25% of the length L or extending along the second direction a distance less than 25% of the width W. The plurality of segments 146 within the region 132 can include straight linear segments 146 that extend along the first direction or the second direction by distances longer than these ranges (see, e.g., FIG. 1C), since the second plate 120 adhered to the TE elements 130 of the thermoelectric sub-assembly 114 prevent the bending of the first plate 110 at these segments 146 to occur more easily (e.g., with less force than if the segments 146 did not exist). The segments 140 outside the region 132 do not benefit from the additional structural rigidity provided by the second plate 120, so certain embodiments described herein utilize segments 140 that are sufficiently short and change direction (e.g., in a serpentine or zigzag pattern) to avoid substantially reducing the force sufficient to bend the first plate 110.

Figure 2A:
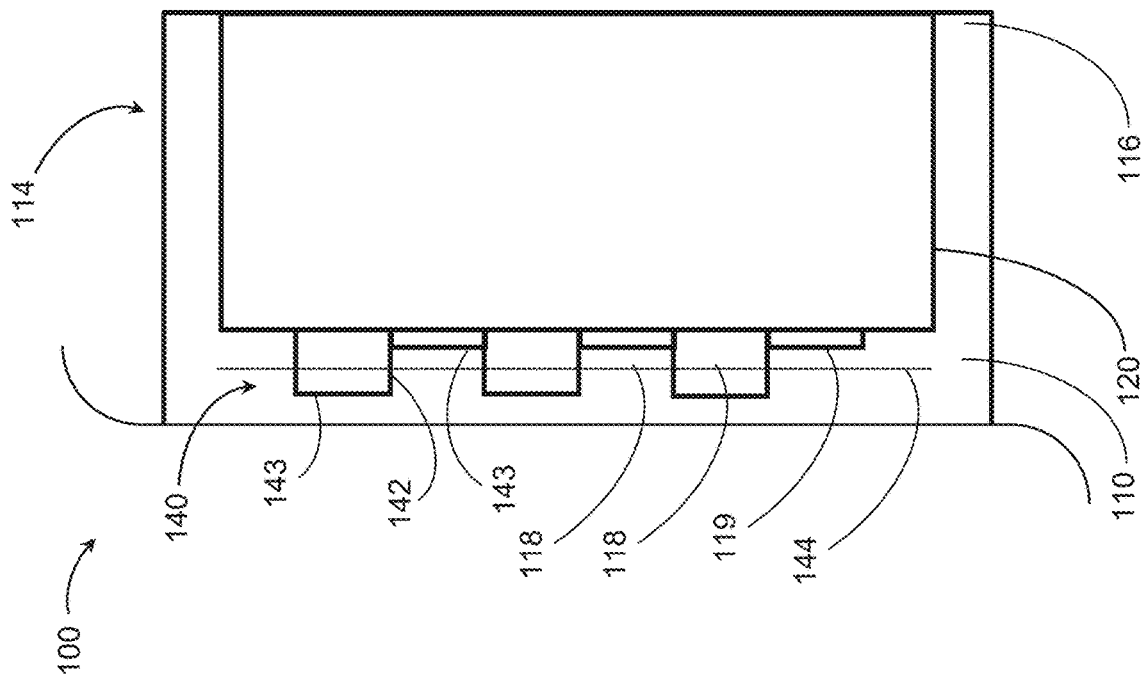
FIGS. 2A-2D schematically illustrate other example pluralities of segments in accordance with certain embodiments described herein.
Figure 2B:
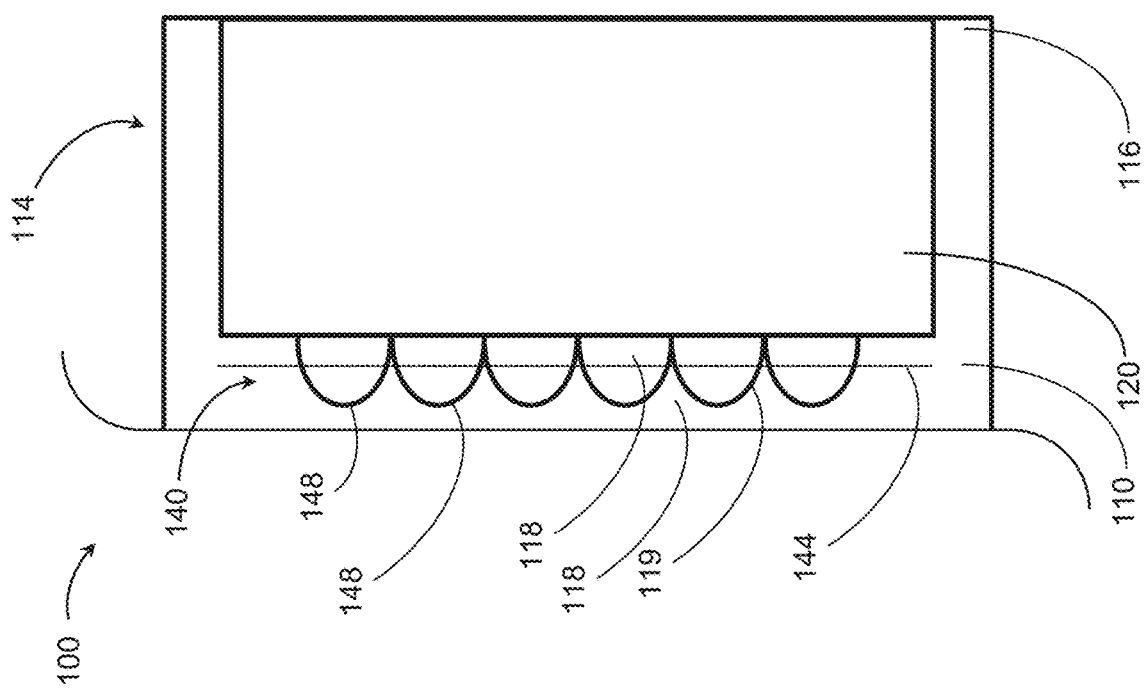
Figure 2C:
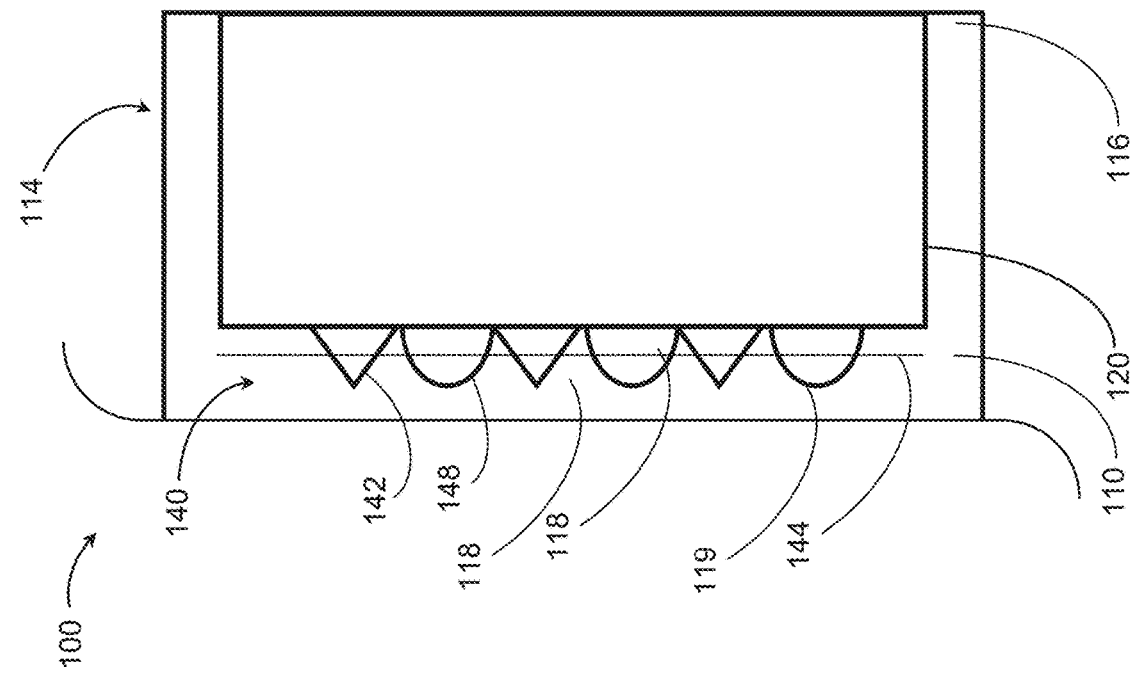
Figure 2D:
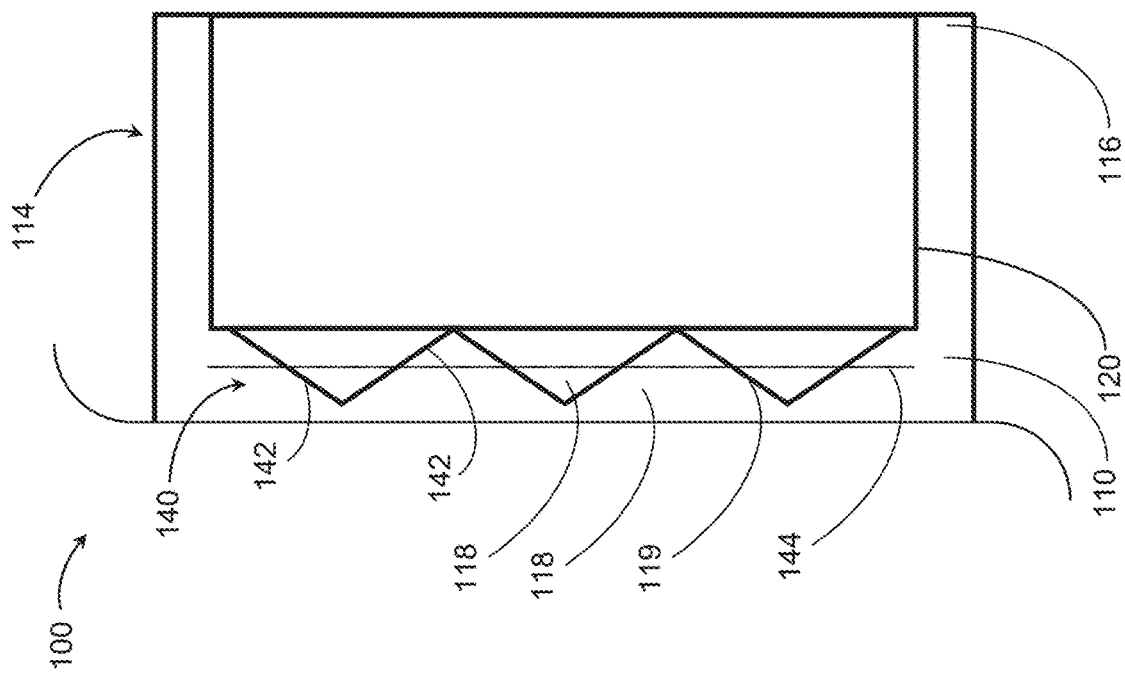
Figure 2E:
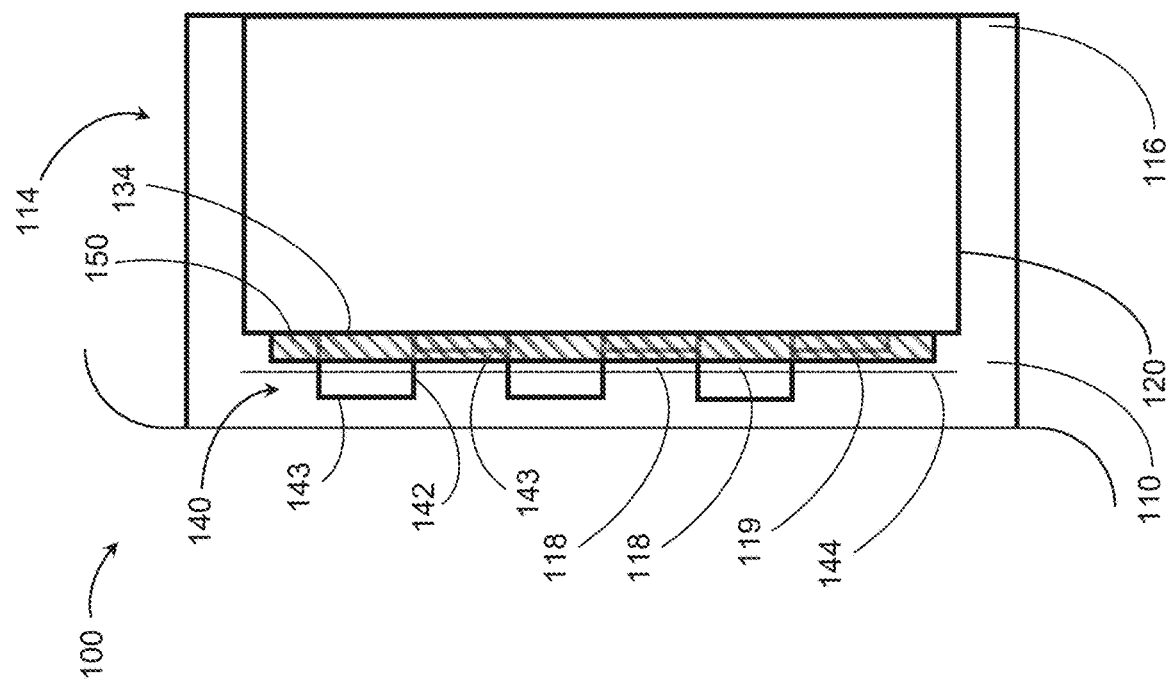
FIG. 2E schematically illustrates another example thermoelectric device in accordance with certain embodiments described herein.

FIG. 2E schematically illustrates another example thermoelectric device 100 in which at least some of the linear segments 142 extend from inside the region 132 to outside the region 132 in accordance with certain embodiments described herein. In the example schematically illustrated by FIG. 2E, the at least one thermoelectric sub-assembly 114 comprises at least one material 150 (e.g., an electrically insulating material; epoxy; polymer) along at least a first portion of a perimeter 134 of the region 132. The at least one material 150 is in mechanical communication with the first plate 110 and the second plate 120, and the at least one material 150 extends over at least a portion of some of the segments 140 (e.g., over at least a portion of the linear segments 142 extending from inside the region 132 to outside the region 132). The at least one material 150 can also extend over segments 143 which extend along the line 144 (e.g., along the perimeter 134), as schematically illustrated by FIG. 2E. The at least one material 150 can provide further structural rigidity to the portion of the first plate 110 outside the region 132. While FIG. 2E shows the at least one material 150 in combination with the linear segments 142, 143 and pattern of segments 140 of FIG. 2B, the at least one material 150 can also be used in combination with other segments 140, having other shapes and/or arranged in other orientations, configurations, and/or patterns.

Figure 3A:
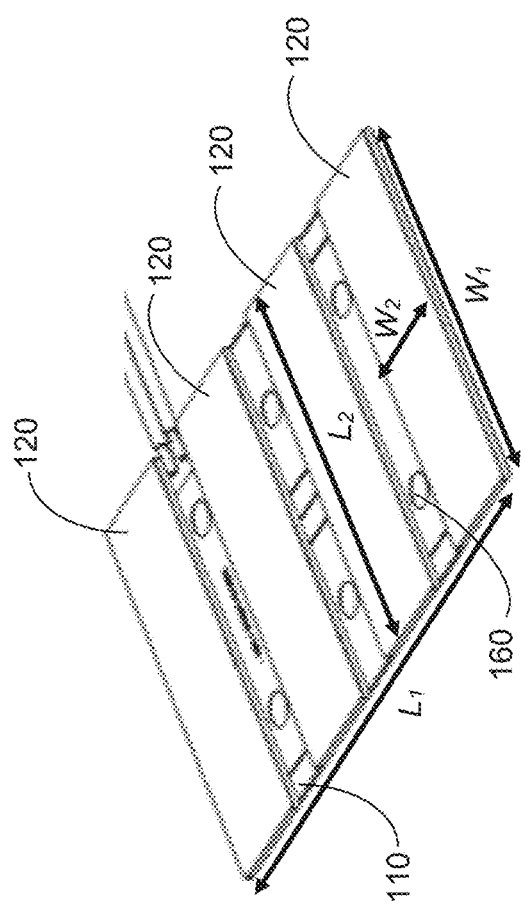
FIGS. 3A and 3B schematically illustrate a perspective view and an exploded view, respectively, of an example thermoelectric device comprising a plurality of thermoelectric sub-assemblies in accordance with certain embodiments described herein.
Figure 3B:
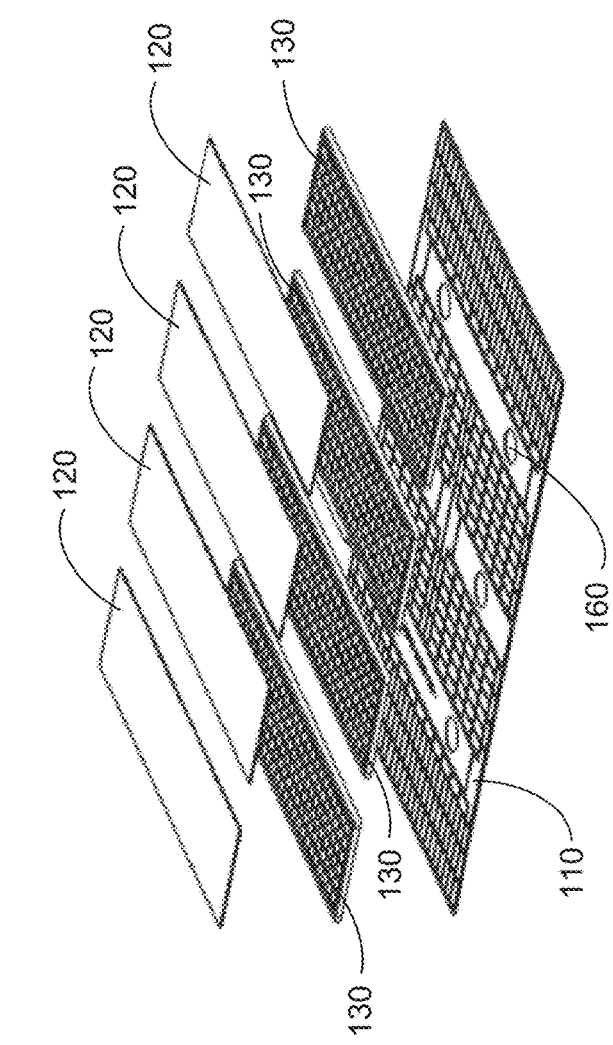

FIGS. 3A and 3B schematically illustrate a perspective view and an exploded view, respectively, of an example thermoelectric device 100 comprising a plurality of thermoelectric sub-assemblies 114 (e.g., four thermoelectric sub-assemblies 114) in accordance with certain embodiments described herein. In FIGS. 3A and 3B, the thermoelectric device 100 comprises a first plate 110 (e.g., PCB) having a rectangular shape with a length $L_1$ and a width $W_1$. The first plate 110 further comprises a plurality of holes 160 (e.g., configured to mount the thermoelectric device 100 within a thermoelectric module) between the thermoelectric sub-assemblies 114. Each of the four thermoelectric sub-assemblies 114 of FIGS. 3A and 3B comprises a plurality of TE elements 130, and a second plate 120 having a rectangular shape with a length $L_2$ and a width $W_2$, and having a plurality of electrically conductive shunts (not shown) (e.g., solder pads) configured to be in electrical and thermal communication with the plurality of TE elements 130. FIG. 3A also shows a pair of electrical conductors (e.g., wires) configured to be in electrical communication with electrically conductive pads (e.g., solder pads) of the first plate 110 and to transmit electrical power to and/or from the thermoelectric sub-assemblies 114. FIGS. 3A and 3B do not show the plurality of segments 140 at least partially outside the region 132, but various configurations of the segments 140 are compatible to be used with the thermoelectric device 100 of FIGS. 3A and 3B in accordance with certain embodiments are described herein.

The thermoelectric sub-assemblies 114 of FIGS. 3A and 3B are substantially equally spaced from one another (e.g., within ±5%; within ±1%) across the first plate 110 with a pair of holes 160 between the longer edges of the second plates 120 of adjacent thermoelectric sub-assemblies 114. In certain other embodiments, the thermoelectric sub-assemblies 114 are not substantially equally spaced from one another, and/or the number of holes 160 between the adjacent thermoelectric sub-assemblies 114 is not equal to two (e.g., one; more than two). The two shorter edges of the second plates 120 of each of the thermoelectric sub-assemblies 114 of FIGS. 3A and 3B are aligned (e.g., flush) with longer edges of the first plate 110, and the two thermoelectric sub-assemblies 114 at opposite ends of the thermoelectric device 100 have one of the longer edges of the second plate 120 aligned (e.g., flush) with a respective shorter edge of the first plate 110. In certain other embodiments, other edges of the first plate 110 and other edges of the second plate 120 can be aligned (e.g., flush) with one another or can extend past one another.

Figure 4B:
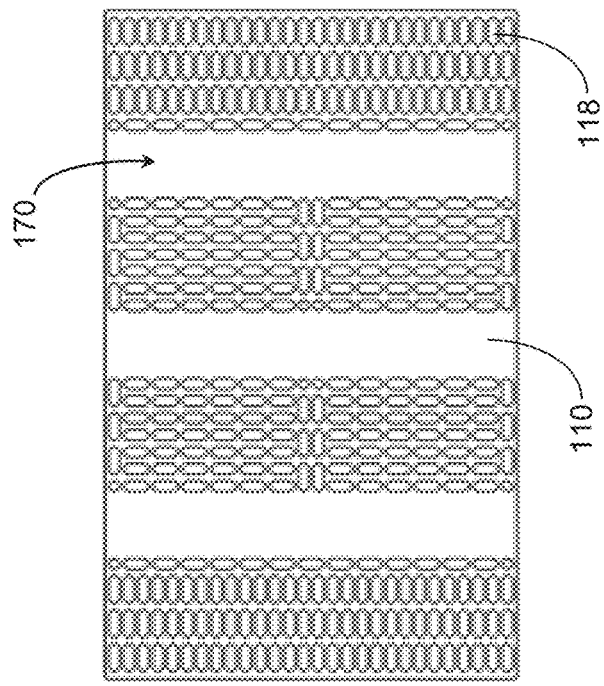
FIG. 4B schematically illustrates the example first plate of FIG. 4A with a solder mask layer in accordance with certain embodiments described herein.
Figure 4A:
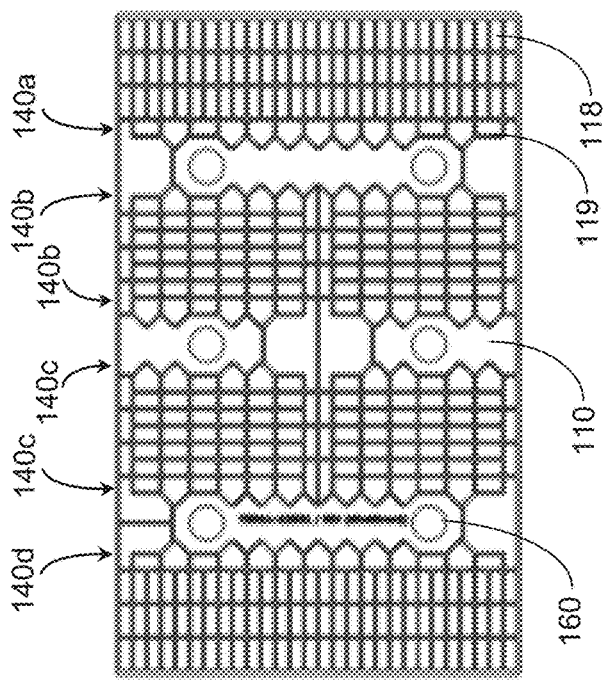
FIG. 4A schematically illustrates an example first plate in accordance with certain embodiments described herein.

FIG. 4A schematically illustrates an example first plate 110 in accordance with certain embodiments described herein. The first plate 110 is configured to support four thermoelectric sub-assemblies 114 and for each thermoelectric sub-assembly 114, the first plate 110 comprises a plurality of electrically insulating second portions 119 comprising a plurality of segments 140 at least partially outside the region 132 of the thermoelectric sub-assembly 114. For example, the thermoelectric sub-assemblies 114 comprise a first and second thermoelectric sub-assemblies 114a, 114b spaced from one another, and the plurality of electrically insulating second portions 119 comprises a first set of segments 140a outside the region 132a of the first thermoelectric sub-assembly 114a and a second set of segments 140b outside the region 132b of the second thermoelectric sub-assembly 114b, with the first set of segments 140a and the second set of segments 140b configured to avoid degradation of the structural rigidity of the first plate 110. Similarly, the second portions 119 comprise third and fourth sets of segments 140c, 140d corresponding to the third and fourth thermoelectric sub-assemblies 114c, 114d.

Figure 4C:
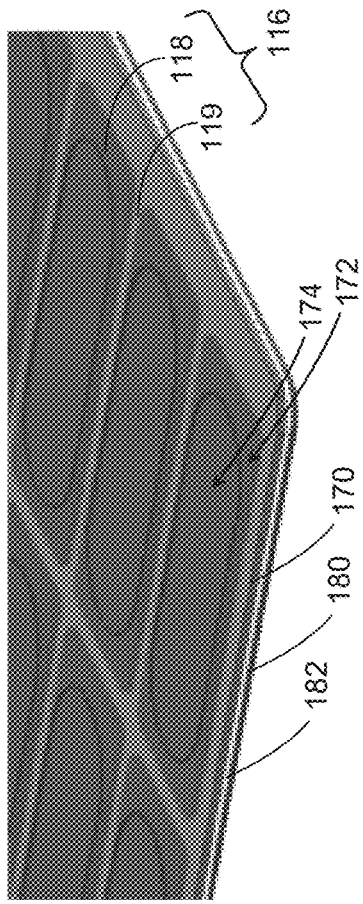
FIG. 4C schematically illustrates a magnified view of a corner of the first plate of FIG. 4B.

FIG. 4B schematically illustrates the example first plate 110 of FIG. 4A (excluding the plurality of holes 160) with a solder mask layer 170 overlaying the plurality of electrically conductive first portions 118 and the plurality of electrically insulating second portions 119 in accordance with certain embodiments described herein. FIG. 4C schematically illustrates a magnified view of a corner of the first plate 110 of FIG. 4B, showing the solder mask layer 170 overlying peripheral regions 172 of the first portions 118 and not overlying central regions 174 (e.g., solder pad regions) of the first portions 118. The central regions 174 are configured to be used as shunts which provide electrical communication and thermal communication to the TE elements 130 of the thermoelectric sub-assemblies 114. FIG. 4C also schematically illustrates that the example first plate 110 has a laminate structure with a metal base layer 180 (e.g., copper; aluminum; metal; metal alloy or composite), an electrically insulating layer 182 (e.g., fiberglass; resin; polymer; fibrous material preimpregnated with a resin material such as epoxy) overlying the metal base, the layer 116 overlaying the electrically insulating layer, and the solder mask layer overlaying the layer 116.

Figure 5:
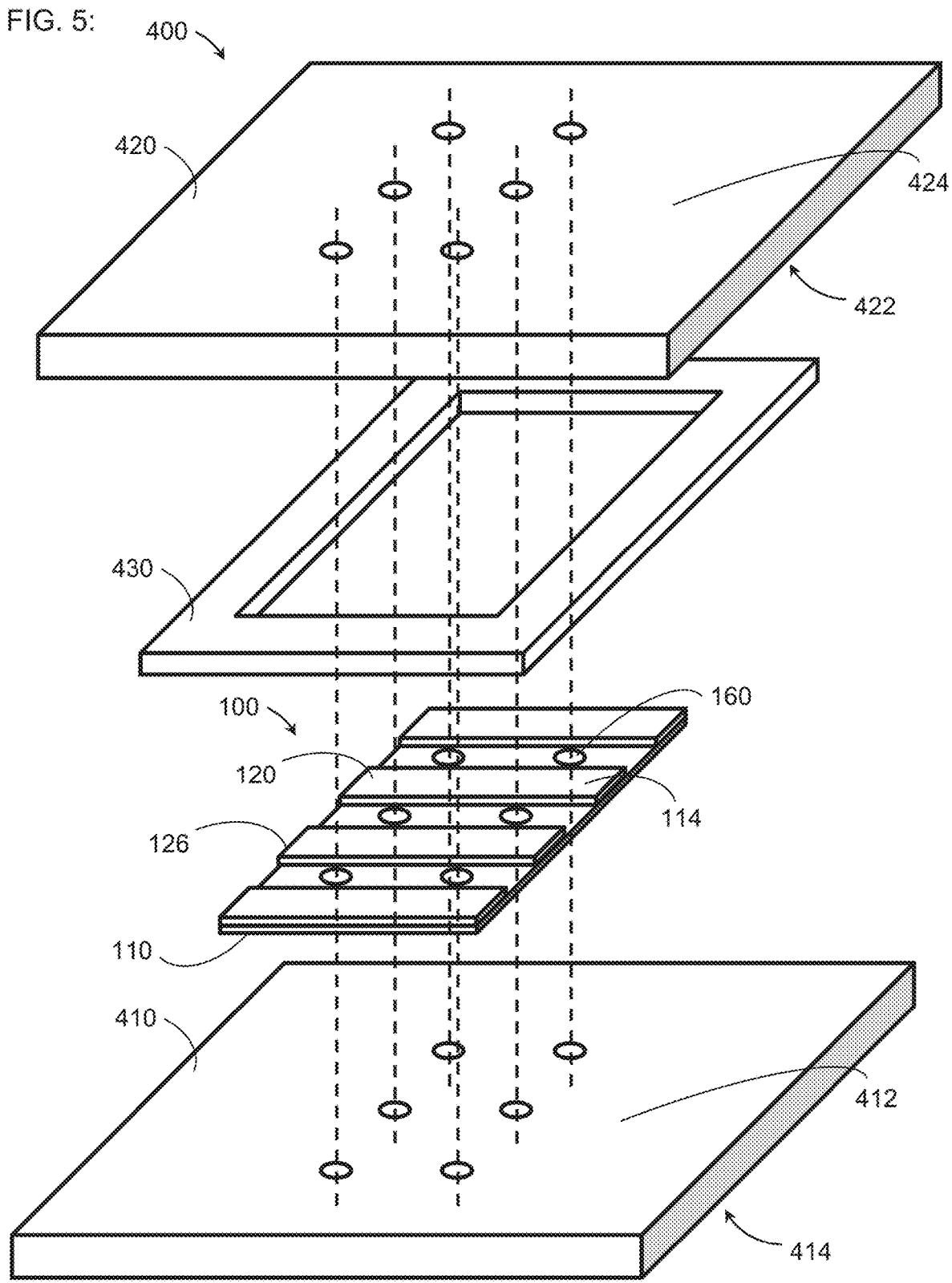
FIG. 5 schematically illustrates a thermoelectric module for thermally conditioning a component in accordance with certain embodiments described herein.

FIG. 5 schematically illustrates a thermoelectric module 400 for thermally conditioning a component (e.g., an electronics component; a battery) in accordance with certain embodiments described herein. The module 400 comprises a first heat spreader 410 and a second heat spreader 420 spaced apart from one another and configured to respectively provide cold and hot sides. The module 400 further comprises a material 430 arranged between the first heat spreader 410 and the second heat spreader 420. The module 400 further comprises a thermoelectric device 100 operatively engaged with the first heat spreader 410 and the second heat spreader 420. In certain embodiments, the first heat spreader 410 and the second heat spreader 420 are configured to be mechanically coupled together by at least one fastener (e.g., bolt; screw; pin; rivet) (not shown).

The thermoelectric device 100 comprises a thermally conductive first plate 110 in thermal communication with the first heat spreader 410 and a plurality of thermoelectric sub-assemblies 114. For example, the first plate 110 can comprise at least one hole 160 configured to have the at least one fastener extend therethrough and the plurality of thermoelectric sub-assemblies 114 can be arranged to have the at least one fastener between adjacent thermoelectric sub-assemblies 114 (see, e.g., FIG. 5). Although not shown in FIG. 5, the first plate 110 comprises electrically conductive first portions 118 and electrically insulating second portions 119 in accordance with certain embodiments described herein (see, e.g., FIGS. 1A-1C, 2A-2E, 3A-3B, and 4A-4C). Each thermoelectric sub-assembly 114 comprises a thermally conductive second plate 120 in thermal communication with the second heat spreader 420 and having a plurality of edges 126, and a plurality of TE elements 130 in a region 132 bounded by and including (e.g., between) the first plate 110 and the second plate 120 and in thermal communication with the first plate 110 and the second plate 120.

In certain embodiments, the first heat spreader 410 and the second heat spreader 420 are configured to transfer heat away from the component to be thermally conditioned. For example, as schematically illustrated by FIG. 5, the first heat spreader 410 can be configured to transfer heat to the thermoelectric device 100 from the component to be thermally conditioned, and the second heat spreader 420 can be configured to transfer heat away from the thermoelectric device 100. The first heat spreader 410 can comprise at least one first surface 412 configured to be in thermal communication with the thermoelectric device 100 and at least one second surface 414 configured to be in thermal communication with the component to be thermally conditioned by the module 400, and the second heat spreader 420 can comprise at least one first surface 422 configured to be in thermal communication with the thermoelectric device 100. For example, at least one second surface 424 of the second heat spreader 420 can comprise at least one heat dissipation structure (e.g., at least one fin) configured to transfer heat from the second heat spreader 420 to the ambient surroundings. For another example, the second heat spreader 420 can be configured to have a fluid coolant (e.g., liquid; air; refrigerant) flow therethrough. While FIG. 5 schematically illustrates an example thermoelectric module 400 in which the first heat spreader 410 provides at least one cold side that receives heat from the component to be thermally conditioned and in which the second heat spreader 420 provides at least one hot side that serves as a heat sink which receives heat from the thermoelectric device 100, in certain other embodiments, the second heat spreader 420 provides the at least one cold side and the first heat spreader 410 provides the at least one hot side.

In certain embodiments, the material 430 comprises a compressible material (e.g., polymer; plastic; rubber; fiberglass) and is configured to be at least partially compressed by the first heat spreader 410 and the second heat spreader 420 during assembly of the thermoelectric module 400 while keeping the first heat spreader 410 and the second heat spreader 420 from contacting one another. In certain embodiments, the material 430 generally surrounds the thermoelectric device 100 (e.g., as shown in FIG. 5), and comprises conduits (e.g., holes; recesses; cut-out portions) (not shown) configured to accommodate one or more electrical conduits (e.g., wires) in electrical communication with the thermoelectric device 100 by allowing the one or more electrical conduits to extend from the thermoelectric device 100 to outside the thermoelectric module 400. In certain embodiments in which the thermoelectric device 100 comprises a plurality of thermoelectric sub-assemblies 114, the material 430 does not extend between the thermoelectric sub-assemblies 114. In certain embodiments, the material 430 provides thermal insulation between the first heat spreader 410 and the second heat spreader 420. For example, the material 430 can have a low thermal conductivity (e.g., less than 10 W/mK) and can be configured to reduce a thermal short between the first heat spreader 410 and the second heat spreader 420 (e.g., heat transfer along a thermal path between the first and second heat spreaders 410, 420 that does not extend through the thermoelectric device 100). In certain embodiments, the material 430 provides hermetic sealing and/or a moisture barrier for the volume occupied by the thermoelectric device 100. For example the material 430 can comprise an insulation ring configured to prevent dust, condensate, moisture, or other particulates and/or fluids from entering the volume occupied by the thermoelectric device 100.

In certain embodiments, the thermoelectric module 400 comprises at least one seal (e.g., hermetic seal) at least partially surrounding a volume containing the thermoelectric elements 130 of the thermoelectric device 100. For example, the at least one seal can comprise at least a portion of the at least one material 150 (e.g., an electrically insulating material; epoxy; polymer) along at least a portion of a perimeter 134 of the region 132. For another example, the at least one seal can comprise a material (e.g., epoxy; acrylic; polymer; silicone) between the first heat spreader 410 and the second heat spreader 420 and at least partially surrounding a volume containing the thermoelectric device 100 (e.g., potting a portion of the volume between the at least one first surface 412 of the first heat spreader 410 and the at least one first surface 422 of the second heat spreader 420. The material can be sufficiently rigid to provide mechanical strength to the thermoelectric module 400. In certain embodiments, additional material (e.g., epoxy; acrylic; polymer; silicone) is located and forms at least one seal between at least one screw head of the at least one fastener (not shown) and the at least one second surface 424 of the second heat spreader 420.

Figure 6:
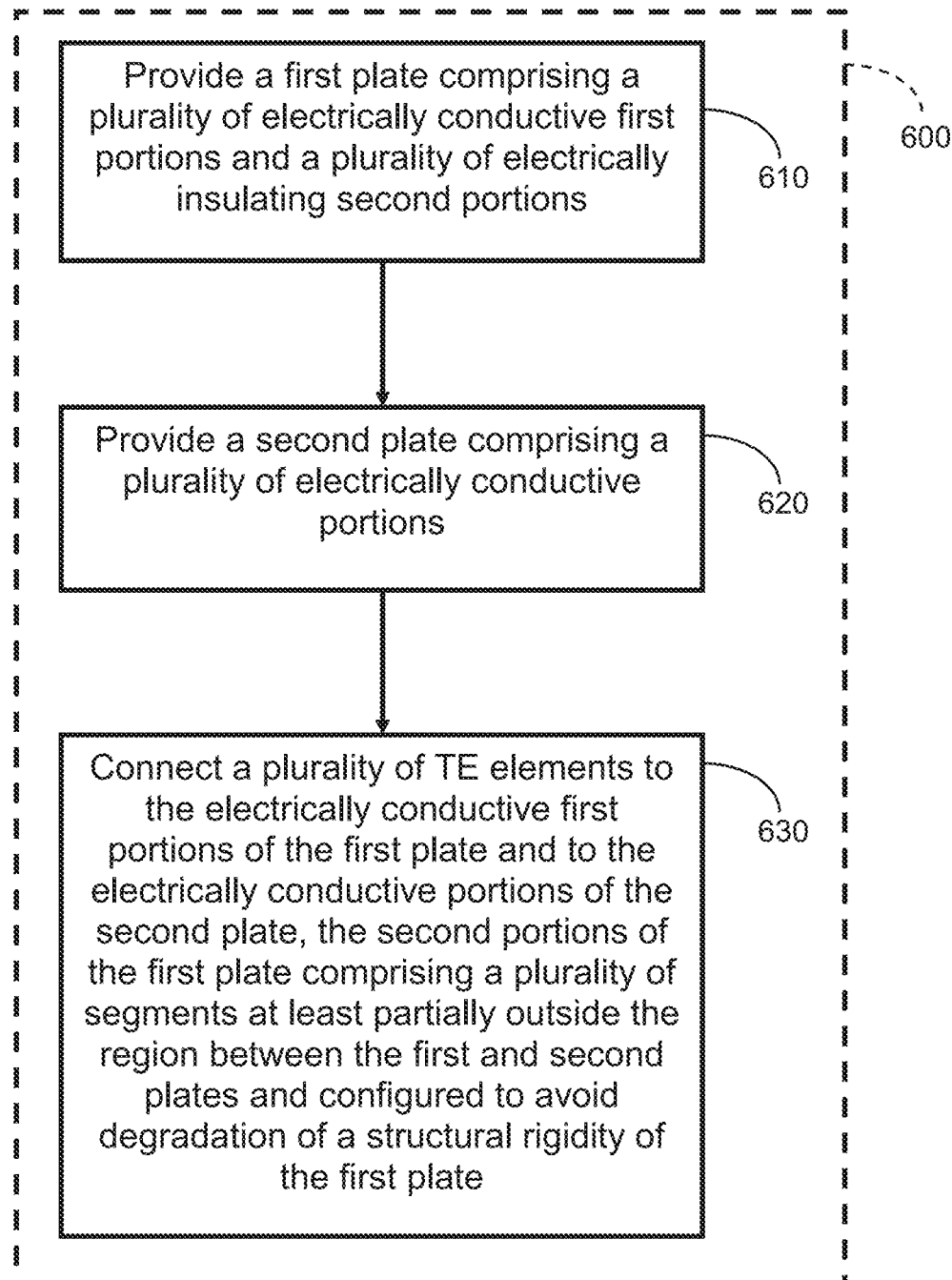
FIG. 6 is a flow diagram of an example method of fabricating a thermoelectric device in accordance with certain embodiments described herein.

FIG. 6 is a flow diagram of an example method 600 of fabricating a thermoelectric device 100 in accordance with certain embodiments described herein. The example method 600 of certain embodiments can also be used for fabricating a thermoelectric module 400. While the method 600 is described by referring to the structures schematically illustrated in FIGS. 1A-1C, 2A-2E, 3A-3B, 4A-4C, and 5, the method 600 is also compatible with other structures.

In an operational block 610, a first plate 110 is provided, the first plate 110 comprising a plurality of electrically conductive first portions 118 and a plurality of electrically insulating second portions 119 separating the first portions 118 from one another. For example, providing the first plate 110 can comprise etching an electrically conductive layer 116 of the first plate 110 to form the plurality of electrically conductive first portions 118 and the plurality of electrically insulating second portions 119.

In an operational block 620, a second plate 120 is provided, the second plate 120 comprising a plurality of electrically conductive portions. For example, providing the second plate 120 can comprise etching an electrically conductive layer of the second plate to form the plurality of electrically conductive portions of the second plate 120.

In an operational block 630, a plurality of TE elements 130 is connected to the plurality of electrically conductive first portions 118 of the first plate 110 and to the plurality of electrically conductive portions of the second plate 120. The plurality of TE elements 130 is in a region 132 between the first plate 110 and the second plate 120 and is in thermal communication with the first plate 110 and with the second plate 120. For example, connecting the plurality of TE elements 130 to the first portions 118 and to the portions of the second plate 120 can comprise applying solder to the first portions 118 of the first plate 110 and to the portions of the second plate 120 and heating the solder to above a temperature above a melting temperature of the solder while the TE elements 130 are in contact with the solder. In certain embodiments, the method 600 further comprises applying a solder mask layer 170 over the first plate 110 such that the solder mask layer 170 does not overlie solder pad regions 174 of the electrically conductive first portions 118, and the solder can be applied to the solder pad regions 174.

The plurality of electrically insulating second portions 119 of the first plate 110 comprise a plurality of segments 140 that are at least partially outside the region 132, and the segments 140 are configured to avoid degradation of a structural rigidity of the first plate 110. As described herein, FIGS. 1A-1C, 2A-2E, 3A-3B, and 4A-4C describe various shapes, orientations, and configurations of the segments 140 in accordance with certain embodiments described herein. Other shapes, orientations, and/or configurations of the segments 140 are also compatible with certain embodiments described herein.

Discussion of the various embodiments herein has generally followed the embodiments schematically illustrated in the figures. However, it is contemplated that the particular features, structures, or characteristics of any embodiments discussed herein may be combined in any suitable manner in one or more separate embodiments not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures. Various features and aspects of the disclosed embodiments can be combined with or substituted for one another. Any methods disclosed herein need not be performed in the order recited.

The ranges disclosed herein also encompass any and all overlap, sub-ranges, and combinations thereof. Language such as "up to," "at least," "greater than," "less than," "between," and the like includes the number recited. With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity. In general, terms used herein are generally intended as "open" terms (e.g., the term "including" should be interpreted as "including but not limited to," the term "having" should be interpreted as "having at least," the term "includes" should be interpreted as "includes but is not limited to," etc.). If a specific number is intended, such an intent will be explicitly recited in the embodiment, and in the absence of such recitation, no such intent is present.

Various embodiments have been described above. Although the inventions have been described with reference to these specific embodiments, the descriptions are intended to be illustrative and are not intended to be limiting. Various modifications and applications may occur to those skilled in the art without departing from the spirit and scope of the inventions as defined in the appended claims.

What is claimed is:

1. A thermoelectric module for thermally conditioning a component, the module comprising:
   first and second heat spreaders spaced apart from one another and configured to respectively provide cold and hot sides and to be mechanically coupled together by at least one fastener;
   a material arranged between the first and second heat spreaders;
   a thermoelectric device operatively engaged with the first and second heat spreaders, the thermoelectric device comprising:
      a thermally conductive first plate in thermal communication with the first heat spreader, the first plate comprising:
         a layer comprising a plurality of electrically conductive first portions and a plurality of electrically insulating second portions separating the first portions from one another; and at least two thermoelectric sub-assemblies, each thermoelectric sub-assembly comprising:
a thermally conductive separate second plate in thermal communication with the second heat spreader; and
a plurality of thermoelectric elements in a region between the first plate and the second plate, the plurality of thermoelectric elements in electrical communication with the plurality of electrically conductive first portions of the first plate, in electrical communication with electrically conductive portions of the second plate, and in thermal communication with the first plate and the second plate, the plurality of electrically insulating second portions comprising a plurality of segments at least partially outside the regions, the segments configured to avoid degradation of a structural rigidity of the first plate, the at least two thermoelectric sub-assemblies positioned on the first plate such that the segments are on the first plate between the at least two thermoelectric sub-assemblies, at least one of the segments extending on the first plate non-orthogonally relative to an edge of one of the second plates, the edge proximate to the at least one of the segments relative to the other edges of the one of the second plates, and the at least one of the segments and at least one other of the segments extending in a triangular pattern on the first plate non-orthogonally relative to the edge of the one of the second plates.

2. The thermoelectric module of claim 1, wherein the first plate comprises an other layer comprising an electrically insulating material, and wherein the other layer continuously extends between the regions of the at least two thermoelectric sub-assemblies along an extent of the first and second heat spreaders.

3. The thermoelectric module of claim 1, wherein at least one segment of the plurality of segments extends on the first plate between the at least two thermoelectric sub-assemblies and connects to at least two other segments of the plurality of segments.

4. The thermoelectric module of claim 1, wherein the plurality of electrically insulating second portions further comprises a plurality of second segments, the plurality of second segments arranged in a rectangular pattern separating the electrically conductive first portions from one another, at least some of the segments in the triangular pattern extending at least partly from the rectangular pattern of the second segments.

5. A thermoelectric device comprising:
a thermally conductive first plate comprising:
a layer comprising a plurality of electrically conductive first portions and a plurality of electrically insulating second portions separating the first portions from one another;

a first thermoelectric sub-assembly comprising:
a thermally conductive second plate; and
a first plurality of thermoelectric elements between the first plate and the second plate, the first plurality of thermoelectric elements in electrical communication with the plurality of electrically conductive first portions of the first plate, in electrical communication with electrically conductive portions of the second plate, and in thermal communication with the first plate and the second plate; and a second thermoelectric sub-assembly comprising:
a thermally conductive third plate; and
a second plurality of thermoelectric elements between the first plate and the third plate, the second plurality of thermoelectric elements in electrical communication with the plurality of electrically conductive first portions of the first plate, in electrical communication with electrically conductive portions of the third plate, and in thermal communication with the first plate and the third plate, the plurality of electrically insulating second portions comprising a plurality of segments extending on the first plate away from an edge of the second plate or the third plate, the segments extending on the first plate between the first thermoelectric sub-assembly and the second thermoelectric sub-assembly, a first segment of the plurality of the segments extending on the first plate non-orthogonally and non-parallel relative to the edge of the second plate or the third plate, and the first segment and a second segment of the plurality of segments extending in a triangular pattern on the first plate non-orthogonally relative to the edge of the second plate or the third plate.

6. The thermoelectric device of claim 5, wherein the plurality of electrically insulating second portions further comprises a plurality of second segments, the plurality of second segments arranged in a rectangular pattern separating the electrically conductive first portions from one another, the first segment and the second segment of the plurality of segments in the triangular pattern extending at least partly from the rectangular pattern of the plurality of second segments.

7. The thermoelectric device of claim 5, wherein the first plate comprises an other layer comprising an electrically insulating material, and wherein the other layer continuously extends between the first and second thermoelectric sub-assemblies.

8. The thermoelectric device of claim 5, wherein a first segment of the plurality of segments extends on the first plate between the first and second thermoelectric sub-assemblies, connects to a second segment of the plurality of segments extending from the edge of the second plate or the third plate, and connects to a third segment of the plurality of segments extending from the other edge of the second plate or the third plate.

* * * * *

UNITED STATES PATENT AND TRADEMARK OFFICE
CERTIFICATE OF CORRECTION

PATENT NO. : 11,075,331 B2
APPLICATION NO. : 16/377134
DATED : July 27, 2021
INVENTOR(S) : Werner Buck It is certified that error appears in the above-identified patent and that said Letters Patent is hereby corrected as shown below:

On the Title Page

On Page 5, Column 2, Item (56), Line 12, under U.S. Patent Documents, delete "Kohlgriiber" and insert --Kohlgruber--.

On Page 6, Column 1, Item (56), Line 25, under U.S. Patent Documents, delete "Magneto" and insert --Magnetto--.

On Page 6, Column 2, Item (56), Line 62, under U.S. Patent Documents, delete "Ba Hash" and insert --Bahash--.

On Page 8, Column 2, Item (56), Line 23, under Foreign Patent Documents, delete "9/1894" and insert --9/1984--.

On Page 8, Column 2, Item (56), Line 28, under Foreign Patent Documents, delete "2 481 4786" and insert --2 481 786--.

On Page 8, Column 2, Item (56), Line 66, under Foreign Patent Documents, delete "11/1995" and insert --8/1996--.

On Page 8, Column 2, Item (56), Line 67, under Foreign Patent Documents, delete "8/1996" and insert --11/1996--.

On Page 8, Column 2, Item (56), Line 68, under Foreign Patent Documents, delete "11/1996" and insert --2/1997--.

On Page 8, Column 2, Item (56), Line 69, under Foreign Patent Documents, delete "2/1997" and insert --4/1997--.

On Page 8, Column 2, Item (56), Line 70, under Foreign Patent Documents, delete "4/1997" and Signed and Sealed this
Ninth Day of August, 2022

*Katherine Kelly Vidal*

Katherine Kelly Vidal
*Director of the United States Patent and Trademark Office*

CERTIFICATE OF CORRECTION (continued)
U.S. Pat. No. 11,075,331 B2 insert --10/1997--.

On Page 8, Column 2, Item (56), Line 72, under Foreign Patent Documents, delete "10/1997" and insert --12/1997--.

On Page 8, Column 2, Item (56), Line 73, under Foreign Patent Documents, delete "12/1997" and insert --1/1998--.

On Page 8, Column 2, Item (56), Line 74, under Foreign Patent Documents, delete "1/1998" and insert --2/1998--.

On Page 9, Column 1, Item (56), Line 46, under Foreign Patent Documents, delete "200-174138" and insert --2004-174138--.

On Page 10, Column 1, Item (56), Line 1, under Other Publications, delete "15/685,915," and insert --15/685,912,--.

On Page 10, Column 2, Item (56), Line 29, under Other Publications, delete "Physics" and insert --Applied Physics--.